(12) United States Patent
Wang et al.

(10) Patent No.: US 12,183,397 B2
(45) Date of Patent: Dec. 31, 2024

(54) MEMORY CIRCUITS AND DEVICES, AND METHODS THEREOF

(71) Applicant: Taiwan Semiconductor Manufacturing Company, Ltd., Hsinchu (TW)

(72) Inventors: Yih Wang, Hsinchu (TW); Tung-Cheng Chang, Xihu Township, Miaoli County (TW); Perng-Fei Yuh, Hsinchu (TW); Gu-Huan Li, Zhubei (TW); Chia-En Huang, Xinfeng Township, Hsinchu County (TW); Chun-Ying Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 171 days.

(21) Appl. No.: 17/644,794

(22) Filed: Dec. 17, 2021

(65) Prior Publication Data

US 2022/0366984 A1    Nov. 17, 2022

Related U.S. Application Data

(60) Provisional application No. 63/188,262, filed on May 13, 2021.

(51) Int. Cl.
| | | |
|---|---|---|
| *G11C 16/26* | (2006.01) | |
| *G11C 16/04* | (2006.01) | |
| *G11C 16/08* | (2006.01) | |
| *G11C 16/30* | (2006.01) | |

(52) U.S. Cl.
CPC .......... *G11C 16/0433* (2013.01); *G11C 16/08* (2013.01); *G11C 16/26* (2013.01); *G11C 16/30* (2013.01)

(58) Field of Classification Search
CPC ..... G11C 16/0433; G11C 16/08; G11C 16/26; G11C 16/30
See application file for complete search history.

(56) References Cited

U.S. PATENT DOCUMENTS

| | | | | |
|---|---|---|---|---|
| 5,923,587 A | * | 7/1999 | Choi | G11C 11/5628 365/185.11 |
| 8,305,808 B2 | * | 11/2012 | Lin | G11C 16/0416 365/185.27 |
| 2004/0136223 A1 | * | 7/2004 | Hsu | G11C 11/22 365/145 |
| 2015/0294695 A1 | * | 10/2015 | Lee | G11C 13/003 365/158 |
| 2015/0348635 A1 | * | 12/2015 | La Rosa | G11C 16/0475 365/185.29 |
| 2016/0141367 A1 | * | 5/2016 | Lee | H01L 29/045 257/368 |
| 2020/0211644 A1 | * | 7/2020 | Sekar | G11C 13/004 |

\* cited by examiner

*Primary Examiner* — Min Huang
(74) *Attorney, Agent, or Firm* — Finnegan, Henderson, Farabow, Garrett & Dunner, L.L.P.

(57) ABSTRACT

A memory circuit includes a plurality of bitcells coupled to a plurality of bitlines, a plurality of wordlines, a plurality of source lines, and a control line. A first of the bitcells and a second of the bitcells are coupled to a first of the bitlines. The first bitcell is coupled to a first of the source lines. The second bitcell is coupled to a second of the source lines. The first source line is different from the second source line.

20 Claims, 16 Drawing Sheets

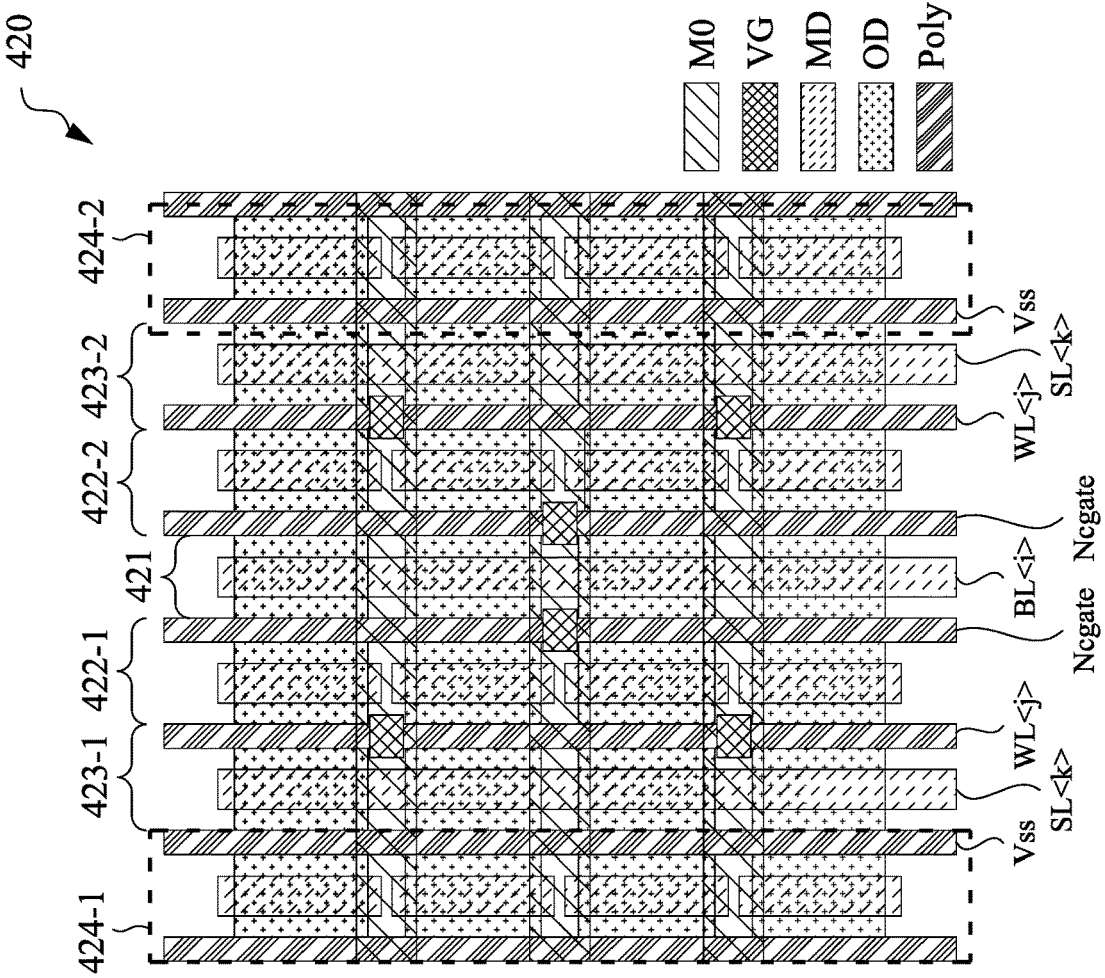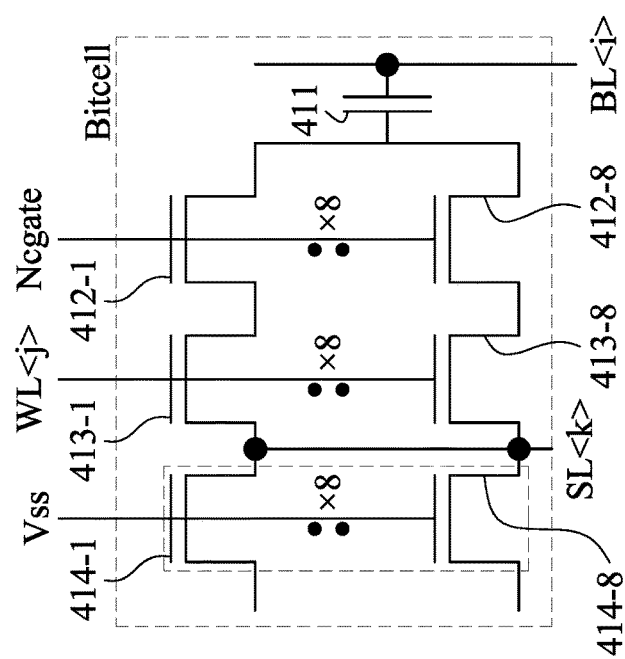
FIG. 4B
FIG. 4A

MEMORY CIRCUITS AND DEVICES, AND METHODS THEREOF

CROSS-REFERENCE TO RELATED APPLICATION

The present application claims the benefit of priority to U.S. Provisional Application No. 63/188,262, filed on May 13, 2021, the entire contents of which are incorporated herein by reference.

BACKGROUND

The present disclosure relates to memory circuits and devices, and their operation.

Memory circuits and devices are required to operate in different scenarios. The memory circuits and devices are also required to be read and written correctly in the different scenarios. The memory circuits and devices may include different circuits and methods of operation to address the different scenarios.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A illustrates a circuit of an exemplary bitcell, in accordance with some embodiments.

FIG. 4B illustrates a layout of the circuit of an exemplary bitcell illustrated in FIG. 4A, in accordance with some embodiments.

DETAILED DESCRIPTION

Figure 1:
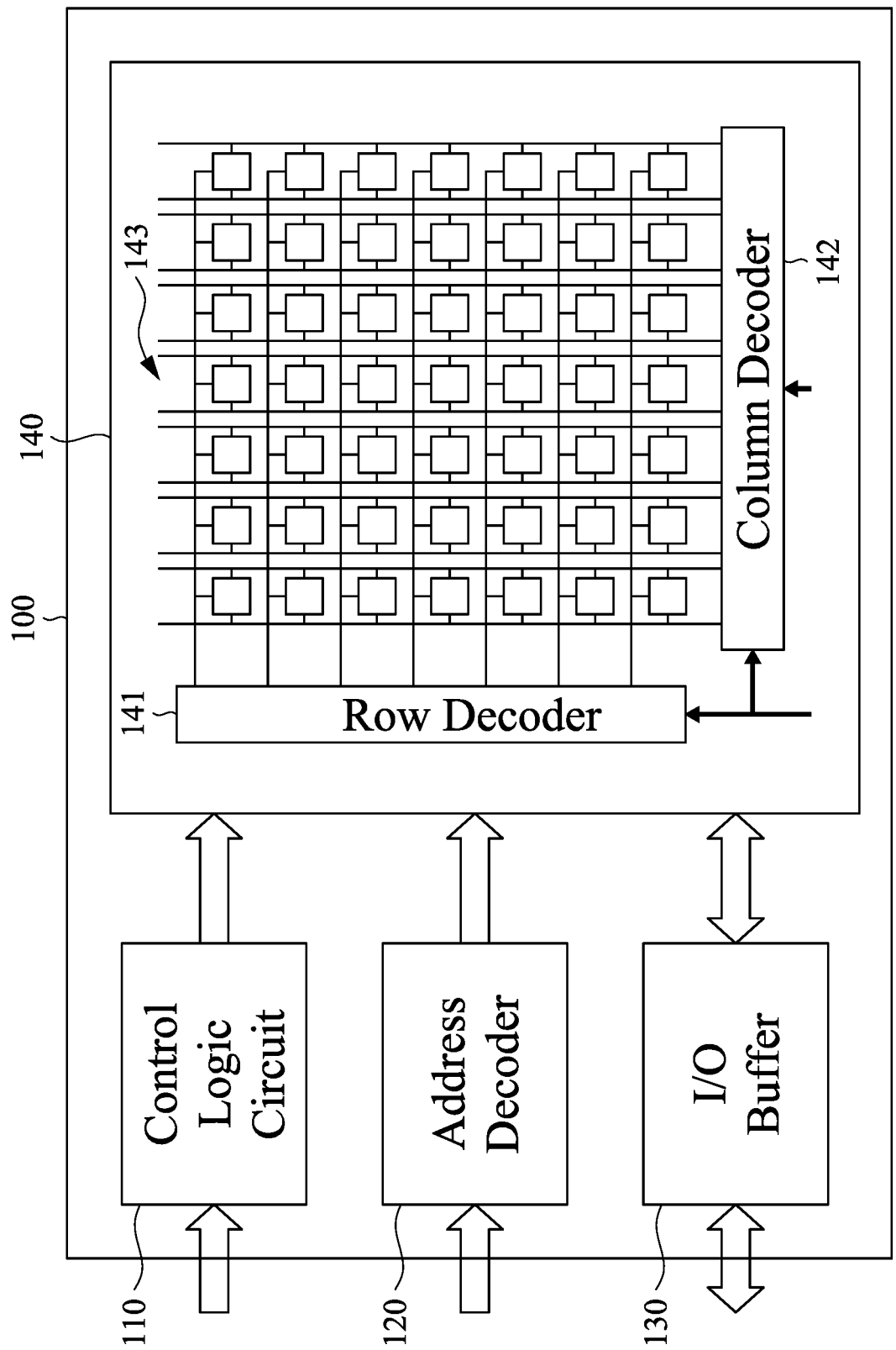
FIG. 1 is a block diagram of an exemplary memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A memory circuit includes a plurality of bitcells for storing data. In some semiconductor manufacturing processes, all source lines of the bitcells may connect to a ground level of voltage for coherence among the bitcells in the memory circuit. When the memory circuit is in a programming mode, some of the bitcells are selected for write operations. Some of the bitcells may be half selected when part of selection-signal lines of these bitcells have a high voltage level. When the bitcells are half selected, the high voltage level at the selection-signal lines and the ground level of voltage at the source line may cause large voltage stress across the bitcells. The large voltage stress may cause write disturbance errors in the memory circuit. Thus, the large voltage stress across the bitcells should be avoided in the memory circuit.

In accordance with some embodiments, source lines of bitcells are separately controlled and supplied with a voltage level higher than a ground level. For example, source lines of unselected bitcells may be separately controlled and supplied with a positive power voltage, $V_{DD}$. The voltage level of $V_{DD}$ at the source lines eliminates the large voltage stress across the unselected bitcells and prevents possible write disturbance errors in the unselected bitcells. Alternatively, source lines of unselected bitcells may be separately controlled and supplied with a positive voltage of $V_{DD}/2$.

The voltage level of $V_{DD}/2$ at the source lines alleviates the voltage stress and reduces write disturbance errors in the unselected bitcells.

In accordance with some embodiments, transistors are added between adjacent bitcells to keep process coherence of the bitcells. For example, in addition to transistors for data storage function, two adjacent bitcells each include an additional transistor and the additional transistors are connected to each other. Gates of the additional transistors are supplied with a negative power voltage, $V_{SS}$. The voltage level of $V_{SS}$ switches off the additional transistors. Nonetheless, the connected additional transistors enable process coherence between the adjacent bitcells. In some embodiments, a connection line between the two additional transistors is not connected any other circuits, i.e., the connection line remains "floating."

Alternatively, additional transistors are added between adjacent bitcells but not connected to each other. For example, two adjacent bitcells each include an additional transistor but the additional transistors are not connected to each other. Gates of the additional transistors are supplied with the negative power voltage, $V_{SS}$. The voltage level of $V_{SS}$ switches off the additional transistors. Source lines of the additional transistors respectively remain floating.

FIG. 1 is a block diagram of an exemplary memory device 100, in accordance with some embodiments. Memory device 100 includes a control logic circuit 110, an address decoder 120, an input/output (I/O) buffer 130, and a memory array 140. Memory array 140 includes a row decoder 141, a column decoder 142, and a bitcell array 143.

Control logic circuit 110 is configured to receive a command signal, decode the command signal into internal control signals, and transmit the internal control signals to memory array 140, address decoder 120, and/or I/O buffer 130.

Address decoder 120 is configured to receive address signals, decode the address signals into row and column addresses, and provide the row and column addresses to row decoder 141 and column decoder 142, respectively.

I/O buffer 130 is configured to receive input data signals and provide the input data signals to memory array 140 for write operations, and receive data signals from memory array 140 and provide the data signals as output data signals for read operations.

Row decoder 141 is configured to receive the row addresses from address decoder 120 and select one or more rows of bitcells in bitcell array 143. Column decoder 142 is configured to receive the column addresses from address decoder 120 and select one or more columns of bitcells in bitcell array 143.

Bitcell array 143 includes a plurality of bitcells arranged in rows and columns, and coupled to a plurality of bitlines, a plurality of wordlines, a plurality of source lines, and one or more control lines. The bitcells are selected for read or write operations based on signals on the bitlines, wordlines, and control lines. The bitcells in bitcell array 143 are implemented as disclosed herein.

Figure 2:
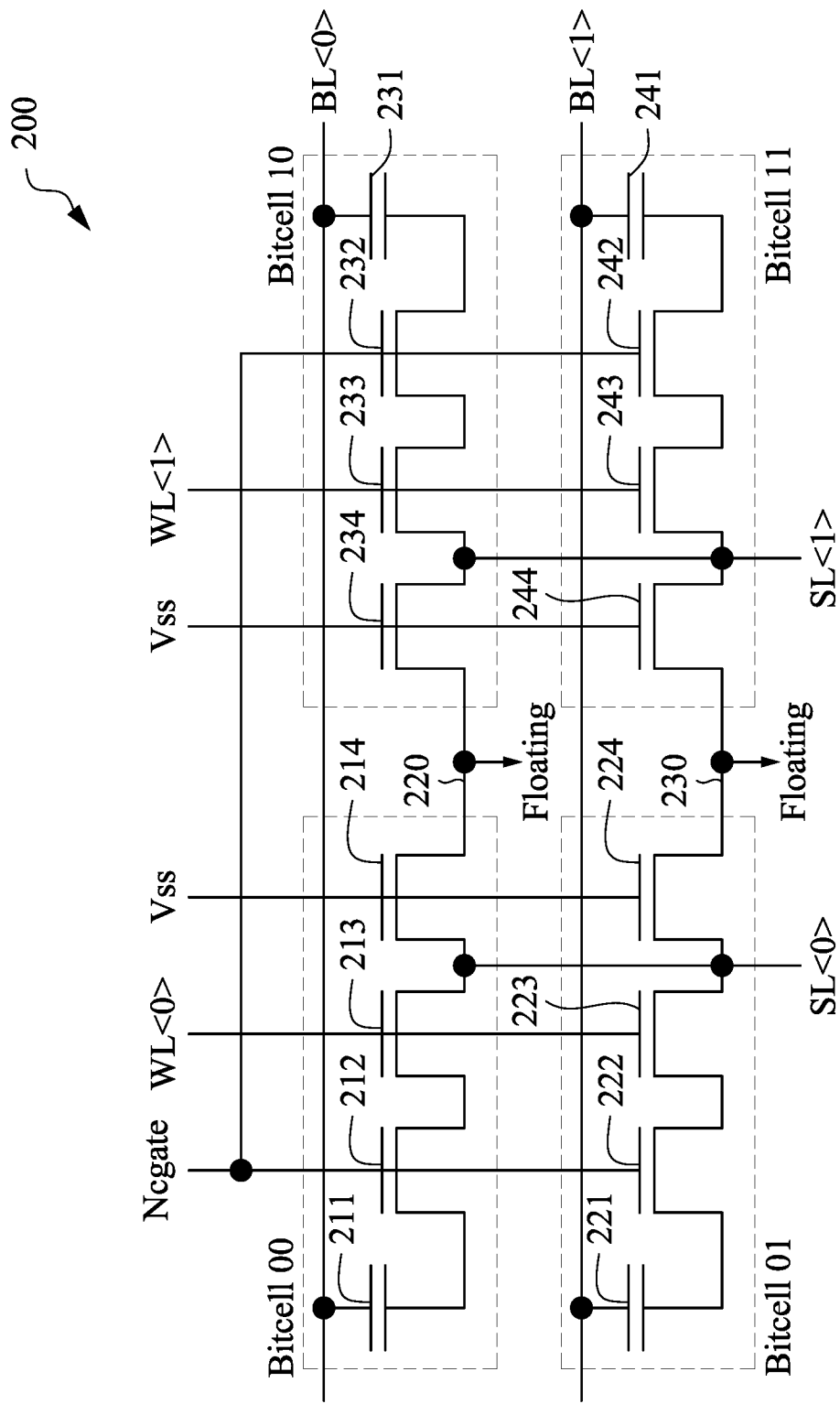
FIG. 2 illustrates an exemplary memory circuit, in accordance with some embodiments.

FIG. 2 illustrates an exemplary memory circuit 200, in accordance with some embodiments. Memory circuit 200 may be implemented in bitcell array 143 of memory device 100 (FIG. 1). A controller (not shown) is configured to control bitcells in memory circuit 200 as described herein. The controller may be implemented by control logic circuit 110 and/or address decoder 120 of memory device 100 (FIG. 1).

As shown in FIG. 2, memory circuit 200 includes four bitcells, i.e., Bitcells 00, 10, 01, and 11. Bitcells 00 and 10 are coupled to a first bitline, BL<0>. Bitcell 00 is also coupled to a first wordline, WL<0>. Bitcell 10 is also coupled to a second wordline, WL<1>. Bitcells 01 and 11 are coupled to a second bitline, BL<1>. Bitcell 01 is also coupled to wordline WL<0>. Bitcell 11 is also coupled to wordline WL<1>.

All transistors in FIG. 2 and other figures in this disclosure are n-type metal-oxide-semiconductor field-effect transistors (NMOSs). One or more of the NMOS transistors may be implemented by p-type metal-oxide-semiconductor field-effect transistors (PMOSs) or other types of transistors as long as their control signals are also modified to perform functions comparable to those of the NMOSs and circuits described herein. To avoid confusion between NMOSs and PMOSs, no "dot" is shown at connection points of signal lines (e.g., Ncgate, WL<0>, WL<1>, and $V_{SS}$) and gates of NMOSs in FIG. 2.

As shown in FIG. 2, Bitcell 00 includes a capacitor 211, three transistors 212, 213, and 214. A terminal of capacitor 211 is coupled to bitline BL<0>. A gate of transistor 212 is coupled to a control line, Ncgate. A gate of transistor 213 is coupled to wordline WL<0>. Capacitor 211 and transistors 212 and 213 are coupled in series and configured to function as a bitcell for data storage. Transistor 213 is also coupled to transistor 214.

As shown in FIG. 2, a source of transistor 213 is coupled to a first source line, SL<0>. When Bitcell 00 is not selected for data access, i.e., BL<0>=0 volts and WL<0>=0 volts, the controller is configured to supply a source-line signal of 0 volts (or a ground level of voltage) to source line SL<0>, i.e., SL<0>=0 volts. The controller is also configured to supply a control signal of 0 volts to control line Ncgate, i.e., $V_{Ncgate}$=0 volts.

When Bitcell 00 is selected for data access, i.e., BL<0>=$V_{QPS}$ volts and WL<0>=$V_{WL}$ volts, the controller is configured to supply a source-line signal of 0 volts (or a ground level of voltage) to source line SL<0>, i.e., SL<0>=0 volts. The controller is also configured to supply a control signal of $V_{Ncgate}$ volts to control line Ncgate, i.e., Ncgate=$V_{Ncgate}$ volts. The voltage $V_{QPS}$ is a power supply voltage for programming a memory, such as a one-time programming (OTP) power supply voltage for programming a non-volatile memory or electronic fuses. The voltage $V_{QPS}$ may be, for example, higher than, equal to, or lower than $V_{DD}$, where $V_{DD}$ is a positive power voltage supplied to core circuits. For example, a memory device may have an input/output power supply voltage of 3.0 volts, an OTP power supply voltage (i.e., $V_{QPS}$) of 2.5 volts, and a core power supply voltage of 1.2 volts. Other values of the input/output power supply voltage, OTP power supply voltage (i.e., $V_{QPS}$), and core power supply voltage may be applied to all memory devices disclosed herein.

When Bitcell 00 is half selected, e.g., BL<0>=0 volts and WL<0>=$V_{WL}$ volts, the controller is configured to supply, for example, a source-line signal of $V_{DD}$ volts (or a positive power voltage) to source line SL<0>, i.e., SL<0>=$V_{DD}$ volts. The controller is also configured to supply a control signal of 0 volts to control line Ncgate, i.e., $V_{Ncgate}$=0 volts.

Alternatively, when Bitcell 00 is half selected, e.g., BL<0>=$V_{QPS}$ volts and WL<0>=0 volts, the controller is configured to supply a source-ling signal of $V_{DD}$ volts (or a positive power voltage) to source line SL<0>, i.e., SL<0>=$V_{DD}$ volts. The controller is also configured to supply a control signal of $V_{Ncgate}$ volts to control line Ncgate, i.e., Ncgate=$V_{Ncgate}$ volts. In this half-selected situation, BL<0>=$V_{QPS}$ volts and SL<0>=$V_{DD}$ volts. The voltage $V_{QPS}$ is equal or close to $V_{DD}$. Thus, there is little or no voltage stress across half-selected Bitcell 00.

In some embodiments, when Bitcell 00 is half selected, the controller is configured to supply a source-line signal of $V_{DD}/2$ volts to source line SL<0>, i.e., SL<0>=$V_{DD}/2$ volts. In this situation, BL<0>=$V_{QPS}$ volts and SL<0>=$V_{DD}/2$ volts. Thus, a voltage difference between BL<0> and SL<0> is $V_{QPS}-V_{DD}/2$ volts. This voltage difference alleviates possible voltage stress across half-selected Bitcell 00.

As shown in FIG. 2, transistor 213 is coupled to transistor 214. A gate of transistor 214 is coupled to a negative power line of $V_{SS}$ volts (or a ground level of voltage). The voltage level of $V_{SS}$ at the gate switches off transistor 214. A source of transistor 214 is coupled to a transistor 234 of Bitcell 10 via a connection line 220. Since a gate of transistor 234 is coupled to a negative power line of $V_{SS}$ volts (or a ground level of voltage), the voltage level of $V_{SS}$ at the gate also switches off transistor 234.

A "floating" terminal in a circuit is defined herein as a terminal that is not connected to any other circuits and therefore carries no current. Because both transistors 214 and 234 are switched off and connection line 220 is not coupled to any other circuits, connection line 220 is considered "floating." The source of transistor 214 and the source of transistor 234 are also considered "floating" although they are coupled to each other. Because transistor 214 is always switched off, transistor 214 does not affect the unselected, selected, and half-selected operations of Bitcell 00 described above.

As shown in FIG. 2, Bitcell 10 includes a capacitor 231 and three transistors 232, 233, and 234. A terminal of capacitor 231 is coupled to bitline BL<0>. A gate of transistor 232 is coupled to control line Ncgate. A gate of transistor 233 is coupled to wordline WL<1>. Capacitor 231 and transistors 232 and 233 are coupled in series and configured to function as a bitcell for data storage. Transistor 233 is also coupled to transistor 234.

A source of transistor 233 is coupled to a second source line, SL<1>. When Bitcell 10 is not selected for data access, i.e., BL<0>=0 volts and WL<1>=0 volts, the controller is configured to supply a source-line signal of 0 volts (or a ground level of voltage) to source line SL<1>, i.e., SL<1>=0 volts. The controller is also configured to supply a control signal of 0 volts to control line Ncgate, i.e., $V_{Ncgate}$=0 volts.

When Bitcell 10 is selected for data access, i.e., BL<0>=$V_{QPS}$ volts and WL<1>=$V_{WL}$ volts, the controller is configured to supply a source-line signal of 0 volts (or a ground level of voltage) to source line SL<1>, i.e., SL<1>=0 volts. The controller is also configured to supply a control signal of $V_{Ncgate}$ volts to control line Ncgate, i.e., Ncgate=$V_{Ncgate}$ volts.

When Bitcell 10 is half selected, e.g., BL<0>=0 volts and WL<1>=$V_{WL}$ volts, the controller is configured to supply, for example, a source-line signal of $V_{DD}$ volts (or a positive power voltage) to source line SL<1>, i.e., SL<1>=$V_{DD}$ volts. The controller is also configured to supply a control signal of 0 volts to control line Ncgate, i.e., $V_{Ncgate}$=0 volts.

Alternatively, when Bitcell 10 is half selected, e.g., BL<0>=$V_{QPS}$ volts and WL<1>=0 volts, the controller is configured to supply a source-line signal of $V_{DD}$ volts (or a positive power voltage) to source line SL<1>, i.e., SL<1>=$V_{DD}$ volts. The controller is also configured to supply a control signal of $V_{Ncgate}$ volts to control line Ncgate, i.e., Ncgate=$V_{Ncgate}$ volts. In this half-selected situation, BL<0>=$V_{QPS}$ volts and SL<1>=$V_{DD}$ volts. The voltage $V_{QPS}$ is equal or close to $V_{DD}$. Thus, there is little or no voltage stress across half-selected Bitcell 10.

In some embodiments, when Bitcell 10 is half selected, the controller is configured to supply a source-line signal of $V_{DD}/2$ volts to source line SL<1>, i.e., SL<1>=$V_{DD}/2$ volts. In this situation, BL<0>=$V_{QPS}$ volts and SL<1>=$V_{DD}/2$ volts. Thus, a voltage difference between BL<0> and SL<1> is $V_{QPS}-V_{DD}/2$ volts. This voltage difference alleviates possible voltage stress across half-selected Bitcell 10.

As shown in FIG. 2, transistor 233 is coupled to transistor 234. As described above for Bitcell 00, the gate of transistor 234 is coupled to the negative power line of $V_{SS}$ volts (or a ground level of voltage). The voltage level of $V_{SS}$ at the gate switches off transistor 234. The source of transistor 234 is coupled to transistor 214 of Bitcell 00 via connection line 220. As described above, connection line 220 is considered "floating" and the sources of transistors 214 and 234 are considered "floating" although they are coupled to each other. Because transistor 234 is always switched off, transistor 234 does not affect the unselected, selected, and half-selected operations of Bitcell 10 described above.

As shown in FIG. 2, Bitcell 01 includes a capacitor 221 and three transistors 222, 223, and 224. A terminal of capacitor 221 is coupled to bitline BL<1>. A gate of transistor 222 is coupled to control line, Ncgate. A gate of transistor 223 is coupled to wordline WL<0>. Capacitor 221 and transistors 222 and 223 are coupled in series and configured to function as a bitcell for data storage. Transistor 223 is also coupled to transistor 224.

A source of transistor 223 is coupled to source line SL<0>. When Bitcell 01 is not selected for data access, i.e., BL<1>=0 volts and WL<0>=0 volts, the controller is configured to supply a source-line signal of 0 volts (or a ground level of voltage) to source line SL<0>, i.e., SL<0>=0 volts. The controller is also configured to supply a control signal of 0 volts to control line Ncgate, i.e., $V_{Ncgate}$=0 volts.

When Bitcell 01 is selected for data access, i.e., BL<1>=$V_{QPS}$ volts and WL<0>=$V_{WL}$ volts, the controller is configured to a supply source-line signal of 0 volts (or a ground level of voltage) to source line SL<0>, i.e., SL<0>=0 volts. The controller is also configured to supply a control signal of $V_{Ncgate}$ volts to control line Ncgate, i.e., Ncgate=$V_{Ncgate}$ volts.

When Bitcell 01 is half selected, e.g., BL<1>=0 volts and WL<0>=$V_{WL}$ volts, the controller is configured to supply, for example, a source-line signal of $V_{DD}$ volts (or a positive power voltage) to source line SL<0>, i.e., SL<0>=$V_{DD}$ volts. The controller is configured to supply a control signal of 0 volts to control line Ncgate, i.e., $V_{Ncgate}$=0 volts.

Alternatively, when Bitcell 01 is half selected, e.g., BL<1>=$V_{QPS}$ volts and WL<0>=0 volts, the controller is configured to supply a source-line signal of $V_{DD}$ volts (or a positive power voltage) to source line SL<0>, i.e., SL<0>=$V_{DD}$ volts. The controller is also configured to supply a control signal of $V_{Ncgate}$ volts to control line Ncgate, i.e., Ncgate=$V_{Ncgate}$ volts. In this half-selected situation, BL<1>=$V_{QPS}$ volts and SL<0>=$V_{DD}$ volts. The voltage $V_{QPS}$ is equal or close to $V_{DD}$. Thus, there is little or no voltage stress across half-selected Bitcell 01.

In some embodiments, when Bitcell 01 is half selected, the controller is configured to supply a source-line signal of $V_{DD}/2$ volts to source line SL<0>, i.e., SL<0>=$V_{DD}/2$ volts. In this situation, BL<1>=$V_{QPS}$ volts and SL<0>=$V_{DD}/2$ volts. Thus, a voltage difference between BL<1> and SL<0> is $V_{QPS}-V_{DD}/2$ volts. This voltage difference alleviates possible voltage stress across half-selected Bitcell 01.

As shown in FIG. 2, transistor 223 is coupled to transistor 224. A gate of transistor 224 is coupled to a negative power line of $V_{SS}$ volts (or a ground level of voltage). The voltage level of $V_{SS}$ at the gate switches off transistor 224. A source of transistor 224 is coupled to a transistor 244 of Bitcell 11 via a connection line 230. Since a gate of transistor 244 is also coupled to a negative power line of $V_{SS}$ volts (or a ground level of voltage), the voltage level of $V_{SS}$ at the gate also switches off transistor 244. Because both transistors 224 and 244 are switched off and connection line 230 is not coupled to any other circuits, connection line 230 is considered "floating." The source of transistor 224 and the source of transistor 244 are also considered "floating" although they are coupled to each other. Because transistor 224 is always switched off, transistor 224 does not affect the unselected, selected, and half-selected operations of Bitcell 01 described above.

As shown in FIG. 2, Bitcell 11 includes a capacitor 241 and three transistors 242, 243, and 244. A terminal of capacitor 241 is coupled to bitline BL<1>. A gate of transistor 242 is coupled to control line Ncgate. A gate of transistor 243 is coupled to wordline WL<1>. Capacitor 241 and transistors 242 and 243 are coupled in series and configured to function as a bitcell for data storage. Transistor 243 is also coupled to transistor 244.

A source of transistor 243 is coupled to source line SL<1>. When Bitcell 11 is not selected for data access, i.e., BL<1>=0 volts and WL<1>=0 volts, the controller is configured to supply a source-line signal of 0 volts (or a ground level of voltage) to source line SL<1>, i.e., SL<1>=0 volts. The controller is also configured to supply a control signal of 0 volts to control line Ncgate, i.e., $V_{Ncgate}$=0 volts.

When Bitcell 11 is selected for data access, i.e., BL<1>=$V_{QPS}$ volts and WL<1>=$V_{WL}$ volts, the controller is configured to supply a source-line signal of 0 volts (or a ground level of voltage) to source line SL<1>, i.e., SL<1>=0 volts. The controller is also configured to supply a control signal of $V_{Ncgate}$ volts to control line Ncgate, i.e., Ncgate=$V_{Ncgate}$ volts.

When Bitcell 11 is half selected, e.g., BL<1>=0 volts and WL<1>=$V_{WL}$ volts, the controller is configured to supply, for example, a source-line signal of $V_{DD}$ volts (or a positive power voltage) to source line SL<1>, i.e., SL<1>=$V_{DD}$ volts. The controller is also configured to supply a control signal of 0 volts to control line Ncgate, i.e., $V_{Ncgate}$=0 volts.

Alternatively, when Bitcell 11 is half selected, e.g., BL<1>=$V_{QPS}$ volts and WL<1>=0 volts, the controller is configured to supply a source-line signal of $V_{DD}$ volts (or a positive power voltage) to source line SL<1>, i.e., SL<1>=$V_{DD}$ volts. The controller is also configured to supply a control signal of $V_{Ncgate}$ volts to control line Ncgate, i.e., Ncgate=$V_{Ncgate}$ volts. In this half-selected situation, BL<1>=$V_{QPS}$ volts and SL<1>=$V_{DD}$ volts. The voltage $V_{QPS}$ is equal or close to $V_{DD}$. Thus, there is no or little voltage stress across half-selected Bitcell 11.

In some embodiments, the controller is configured to supply a source-line signal of $V_{DD}$/2 volts to source line SL<1>, i.e., SL<1>=$V_{DD}$/2 volts. In this situation, BL<1>=$V_{QPS}$ volts and SL<1>=$V_{DD}$/2 volts. Thus, a voltage difference between BL<1> and SL<1> is $V_{QPS}$-$V_{DD}$/2 volts. This voltage difference alleviates possible voltage stress across half-selected Bitcell 11.

As shown in FIG. 2, transistor 243 is coupled to transistor 244. As described above for Bitcell 01, the gate of transistor 244 is coupled to the negative power line of $V_{SS}$ volts (or a ground level of voltage). The voltage level of $V_{SS}$ at the gate switches off transistor 244. The source of transistor 244 is coupled to transistor 224 of Bitcell 01 via connection line 230. As described above, connection line 230 is considered "floating" and the sources of transistors 224 and 244 are considered "floating" although they are coupled to each other. Because transistor 244 is always switched off, transistor 244 does not affect the unselected, selected, and half-selected operations of Bitcell 11 described above.

Figure 3:
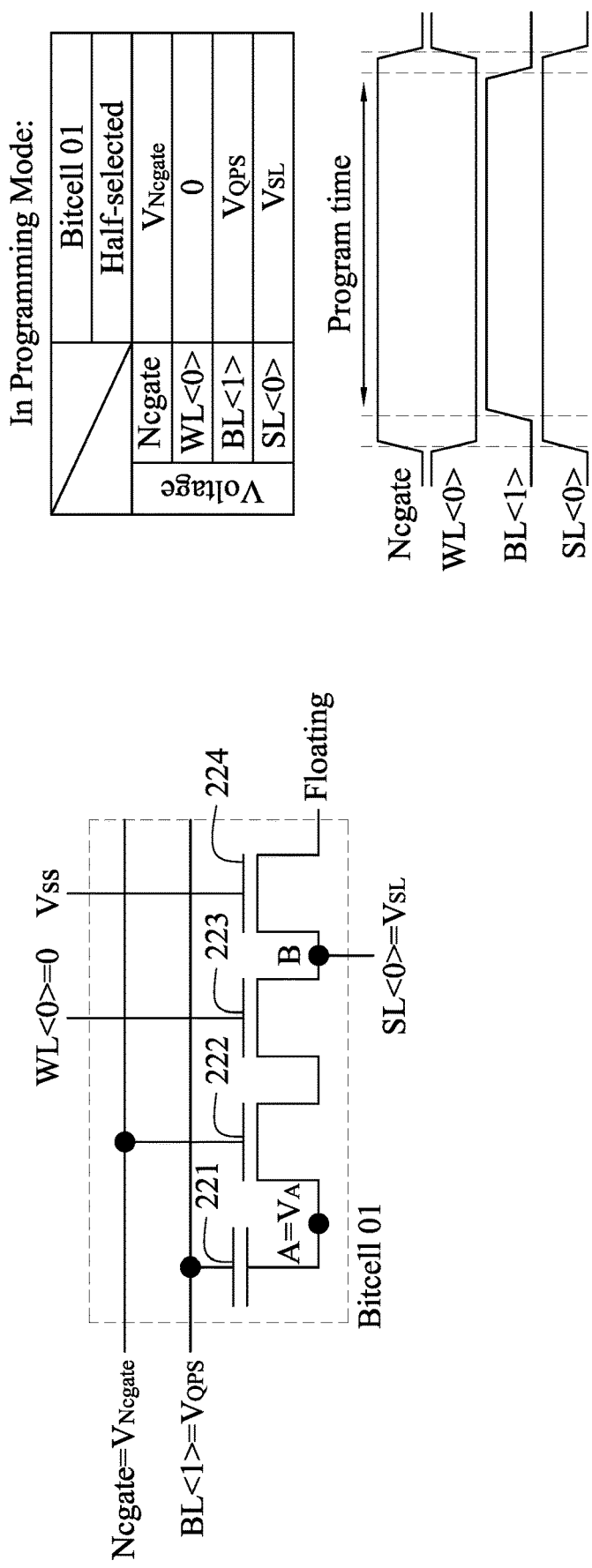
FIG. 3 illustrates an exemplary half-selected bitcell in a programming mode, in accordance with some embodiments.

FIG. 3 illustrates exemplary half-selected Bitcell 01 in a programming mode, in accordance with some embodiments. Bitcell 01 (FIG. 3) is Bitcell 01 in FIG. 2 in a programming mode. As shown in FIG. 3, Bitcell 01 includes capacitor 221 and transistors 222, 223, and 224. Capacitor 221 is coupled to bitline BL<1>. The gate of transistor 222 is coupled to control line, Ncgate. The gate of transistor 223 is coupled to wordline WL<0>. The gate of transistor 224 is coupled to the negative power line of $V_{SS}$. The source of transistor 224 remains floating.

In the programming mode, the controller is configured to select bitcells for writing data therein. When the controller is configured to not select Bitcell 01, the controller is configured to supply a wordline signal of 0 volts to wordline WL<0>, i.e., WL<0>=0 volts. However, in some situations, the controller may nonetheless need to select one or more bitcells coupled to bitline BL<1>, such as Bitcell 11 (FIG. 2). In such a situation, the controller is configured to supply a bitline signal of $V_{QPS}$ volts to bitline BL<1>, i.e., BL<1>=$V_{QPS}$ volts. The voltage $V_{QPS}$ is, for example, $V_{DD}$. The controller is also configured to supply a control signal of $V_{Ncgate}$ volts to control line Ncgate, i.e., Ncgate=$V_{Ncgate}$ volts. In this situation, Bitcell 01 is half selected because BL<1>=$V_{QPS}$ volts and WL<0>=0 volts.

In the half-selected situation, the controller is also configured to supply a source-line signal of $V_{SL}$ volts to source line SL<0>, i.e., SL<0>=$V_{SL}$ volts. A voltage difference between bitline BL<1> and source line SL<0> is $V_{QPS}$-$V_{SL}$. The voltage $V_{SL}$ is higher than a ground level of voltage. For example, $V_{SL}$=$V_{DD}$. When the controller is configured to supply a source-line signal of $V_{DD}$ to SL<0>, the voltage difference between bitline BL<1> and source line SL<0> is $V_{QPS}$-$V_{DD}$. When $V_{QPS}$=$V_{DD}$, the voltage difference between bitline BL<1> and source line SL<0> is 0 volts. That is, there is no voltage stress across half-selected Bitcell 01. In this situation, even though there is a possibility of leakage current in transistors 222 and 223 from point A to point B (FIG. 3), the leakage current does not occur because of no voltage stress across Bitcell 01. Since there is no voltage stress, capacitor 221 does not break down during the programming mode. The write disturbance therefore does not occur in half-selected Bitcell 01.

As another example, the controller is configured to supply a source-line signal of $V_{DD}$/2 to SL<0>, and a voltage difference between bitline BL<1> and source line SL<0> is $V_{QPS}$- $V_{DD}$/2. The voltage $V_{QPS}$ is, for example, $V_{DD}$. As a result, the voltage difference between bitline BL<1> and source line SL<0> is $V_{DD}$/2 volts. That is, there is a voltage stress of $V_{DD}$/2 volts across half-selected Bitcell 01. In this situation, if it is possible that transistors 222 and 223 have leakage currents from point A to point B (FIG. 3), the voltage stress of $V_{DD}$/2 volts across Bitcell 01 would at least reduce the leakage currents, as compared to, for example, the voltage stress of $V_{DD}$. Therefore, capacitor 221 is less likely to break down during the programming mode and the write disturbance may not occur in half-selected Bitcell 01.

In some embodiments, capacitor 221 has a breakdown voltage $V_C$. In the programming mode, the controller may be configured to supply a source-line signal of $V_{SL}$ volts to source line SL<0>, where the voltage level of $V_{SL}$ results in the voltage difference $V_{QPS}$-$V_{SL}$ being not greater than $V_C$, i.e., $V_{QPS}$-$V_{SL}$ $V_C$. Therefore, a voltage difference across capacitor 221 is not greater than the breakdown voltage $V_C$.

As a result, capacitor 221 does not break down during the programming mode and there is no write disturbance error in half-selected Bitcell 01.

In some embodiments, in the programming mode, the controller is configured to adjust both the voltage levels of $V_{QPS}$ and $V_{SL}$ so that the voltage difference $V_{QPS}-V_{SL}$ is not greater than $V_C$, i.e., $V_{QPS}-V_{SL}$ $V_C$. As long as the voltage difference across capacitor 221 is not greater than the breakdown voltage $V_C$, capacitor 221 does not break down during the programming mode. No write disturbance error occurs in half-selected Bitcell 01.

Still with reference to FIG. 3 and the programming mode, if the voltage level of $V_{SL}$ is not high enough, a voltage difference from point A to point B (FIG. 3) may be large enough to permit leakage currents occur in transistors 222 and 223. When the leakage currents occur, a voltage level of $V_A$ at point A may be pulled down to the same voltage level of $V_{SL}$ at point B, i.e., $V_A=V_{SL}$. The voltage difference across capacitor 221 then becomes $V_{QPS}-V_{SL}$. A low $V_{SL}$ may result in $V_{QPS}-V_{SL}>V_C$. For example, if $V_{SL}=0$ volts, the voltage difference across capacitor 221 is: $V_{QPS}-0=V_{QPS}$. If $V_{QPS}=V_{DD}>V_C$, capacitor 221 may break down. That is, a write disturbance error occurs in half-selected Bitcell 01. Thus, the controller is required to supply a source-line signal of $V_{SL}$ to source line SL<0> that is high enough to prevent the breakdown of capacitor 221, i.e., to prevent a write disturbance error. For example, when the controller is also configured to supply a bitline signal of $V_{DD}$ to BL<1> for enhancing programming performance, the controller is required to supply a source-line signal of $V_{SL}$ that is high enough so that $V_{DD}-V_{SL} \leq V_C$.

In some embodiments, the controller is restricted to supply a bitline signal of $V_{QPS}$ volts to BL<1> that is less than the breakdown voltage $V_C$ of capacitor 221. Such a restriction may reduce programming performance because of the low voltage level on bitline BL<1>.

As shown on the right side of FIG. 3, the controller is configured to supply a high-level signal of $V_{SL}$ to source line SL<0> earlier than supplying a high-level signal of $V_{QPS}$ to bitline BL<1>. When bitline BL<1> changes to the high-level signal (i.e., $V_{QPS}$), Bitcell 01 is half selected. The high-level signal of $V_{SL}$ at source line SL<0> protects half-selected Bitcell 01 from a write disturbance error, as described above with reference to Bitcell 01 in FIG. 3.

The controller may be also configured to protect other half-selected bitcells, such as Bitcells 00, 10, and 11 (FIG. 2) and the bitcells of bitcell array 143 (FIG. 1), from write disturbance errors in the programming mode, as described above with reference to Bitcell 01 in FIG. 3.

FIG. 4A illustrates a circuit 400 of an exemplary bitcell, in accordance with some embodiments. Circuit 400 includes a capacitor 411, eight transistors 412-1 to 412-8 in parallel, eight transistors 413-1 to 413-8 in parallel, and eight transistors 414-1 to 414-8 in parallel. A terminal of capacitor 411 is coupled to a bitline BL<i>. All gates of transistors 412-1 to 412-8 are coupled to a control line, Ncgate. All gates of transistors 413-1 to 413-8 are coupled to a wordline WL<j>. Capacitor 411, each of transistors 412-1 to 412-8, and each of transistors 413-1 to 413-8 are coupled in series and configured to function as a bitcell for data storage. All sources of transistors 413-1 to 413-8 are coupled to a source line SL<k>. Transistors 413-1 to 413-8 are also coupled to transistors 414-1 to 414-8, respectively.

Eight transistors 412-1 to 412-8 in parallel operate in the bitcell (FIG. 4A) equivalent to transistor 222 in Bitcell 01 (FIG. 3). Eight transistors 413-1 to 413-8 in parallel operate in the bitcell (FIG. 4A) equivalent to transistor 223 in Bitcell 01 (FIG. 3). Eight transistors 414-1 to 414-8 in parallel operate in the bitcell (FIG. 4A) equivalent to transistor 224 in Bitcell 01 (FIG. 3). The parallel transistors (FIG. 4A) increase an amount of current that the bitcell can handle.

In some embodiments, other numbers of capacitors, first transistors in parallel, second transistors in parallel, and third transistors in parallel may be coupled in a bit cell and operate equivalent to capacitor 221, transistors 222, 223, and 224 in Bitcell 01 (FIG. 3), as described above with reference to FIG. 4A.

FIG. 4B illustrates a layout 420 of circuit 400 of the exemplary bitcell illustrated in FIG. 4A, in accordance with some embodiments. More particularly, layout 420 is an exemplary layout of circuit 400 (FIG. 4A) with nanosheet transistors in, for example, a 3 nanometer (nm) semiconductor process. Layout 420 includes a metal zero (M0) level, a via over gate (VG) level, a metal diffusion (MD) level, an oxide diffusion (OD) level (i.e., an active layer), and a polysilicon (Poly) level. Layout 420 includes layout regions 421, 422-1, 422-2, 423-1, 423-2, 424-1, and 424-2.

Layout region 421 includes a capacitor corresponding to capacitor 411 (FIG. 4A). A terminal of the capacitor is coupled to bitline BL<i> through an MD level of layout region 421. Layout regions 422-1 and 422-2 each include four NMOS transistors. The eight NMOS transistors correspond to transistors 412-1 to 412-8 (FIG. 4A). Gates of the eight NMOS transistors in layout regions 422-1 and 422-2 are coupled to the control line Ncgate through vias on VG levels of layout regions 422-1 and 422-2.

Layout regions 423-1 and 423-2 each include four NMOS transistors. The eight NMOS transistors of layout regions 423-1 and 423-2 correspond to transistors 413-1 to 413-8 (FIG. 4A). Gates of the eight NMOS transistors in layout regions 423-1 and 423-2 are coupled to the wordline WL<j> through VG levels of layout regions 423-1 and 423-2. Sources of the eight NMOS transistors are coupled to the source line SL<k> through MD levels of layout regions 423-1 and 423-2.

Layout regions 424-1 and 424-2 each include four NMOS transistors. The eight NMOS transistors of layout regions 424-1 and 424-2 correspond to transistors 414-1 to 414-8 (FIG. 4A). Gates of the eight NMOS transistors in layout regions 424-1 and 424-2 are coupled to the negative power level of $V_{SS}$ through Poly levels of layout regions 424-1 and 424-2.

Figure 5A:
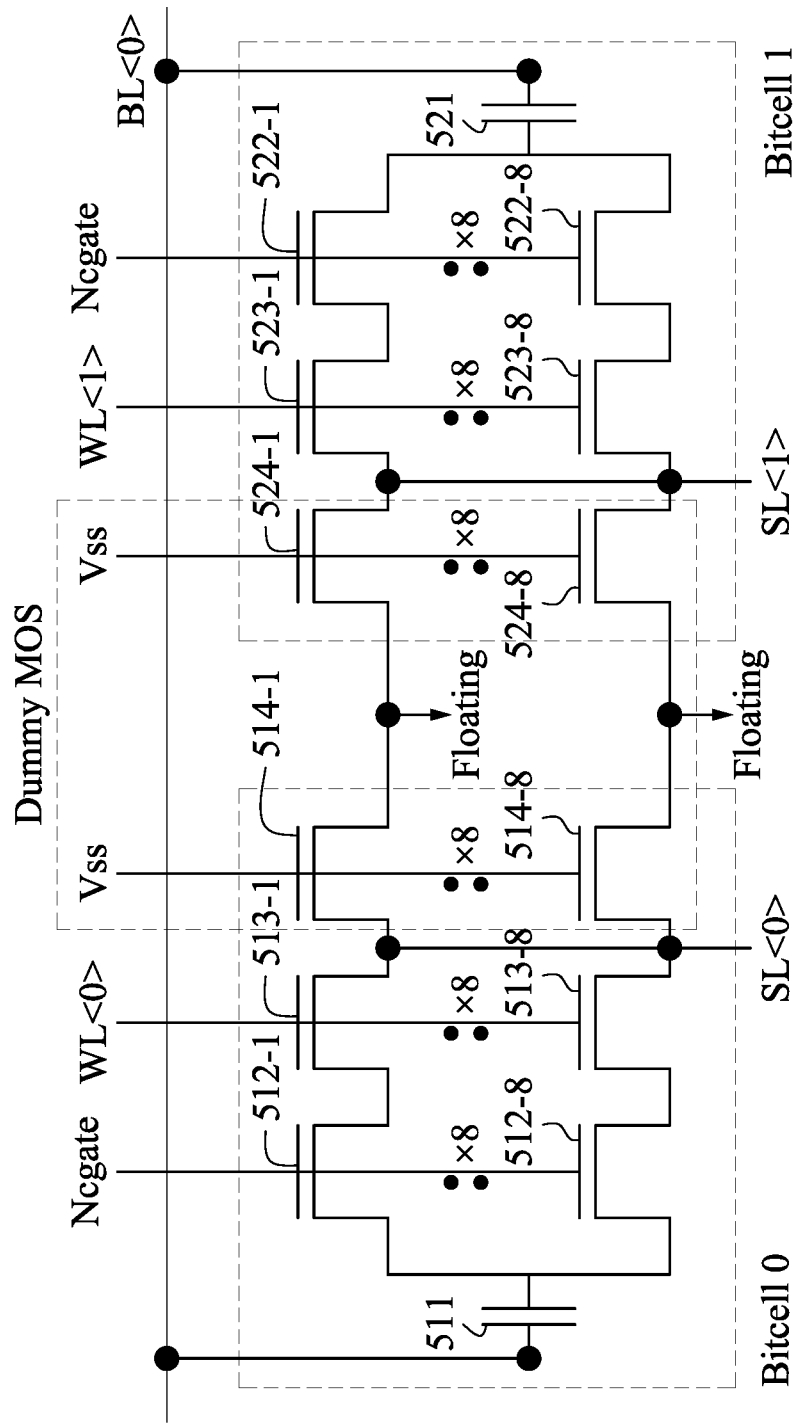
FIG. 5A illustrates a circuit of exemplary bitcells, in accordance with some embodiments.

FIG. 5A illustrates a circuit 500 of exemplary bitcells, in accordance with some embodiments. Circuit 500 includes Bitcells 0 and 1. Bitcell 0 includes a capacitor 511 and NMOS transistors 512-1 to 512-8, 513-1 to 513-8, and 514-1 to 514-8 corresponding to capacitor 411 and NMOS transistors 412-1 to 412-8, 413-1 to 413-8, and 414-1 to 414-8 of circuit 400 in FIG. 4A. Bitcell 1 includes a capacitor 521 and NMOS transistors 522-1 to 522-8, 523-1 to 523-8, and 524-1 to 524-8 corresponding to capacitor 411 and NMOS transistors 412-1 to 412-8, 413-1 to 413-8, and 414-1 to 414-8 of circuit 400 in FIG. 4A. Accordingly, the capacitors and NMOS transistors in Bitcell 0 and Bitcell 1 are coupled in a similar manner and operate to provide similar functions as described above for circuit 400.

Bitcell 0 is coupled to a bitline BL<0>, a wordline WL<0>, a control line Ncgate, and a source line SL<0>. Bitcell 1 is coupled to bitline BL<0>, a wordline WL<1>, control line Ncgate, and a source line SL<1>. Bitcells 0 and 1 operate similarly to Bitcells 00 and 10 (FIG. 2).

NMOS transistors 514-1 to 514-8 of Bitcell 0 are respectively coupled to NMOS transistors 524-1 to 524-8 of Bitcell 1 through connection lines. Each connection line remains floating, similar to connection line 220 or 230 (FIG. 2). In some embodiments, NMOS transistors 514-1 to 514-8 and 524-1 to 524-8 are considered as dummy MOS transistors because they do not affect main functions of Bitcells 0 and 1, i.e., read and write operations and data storage. The dummy MOS transistors provide OD coherence between Bitcells 0 and 1 that is required in some semiconductor manufacturing processes, such as 2, 3, and 7 nm semiconductor processes.

Figure 5B:
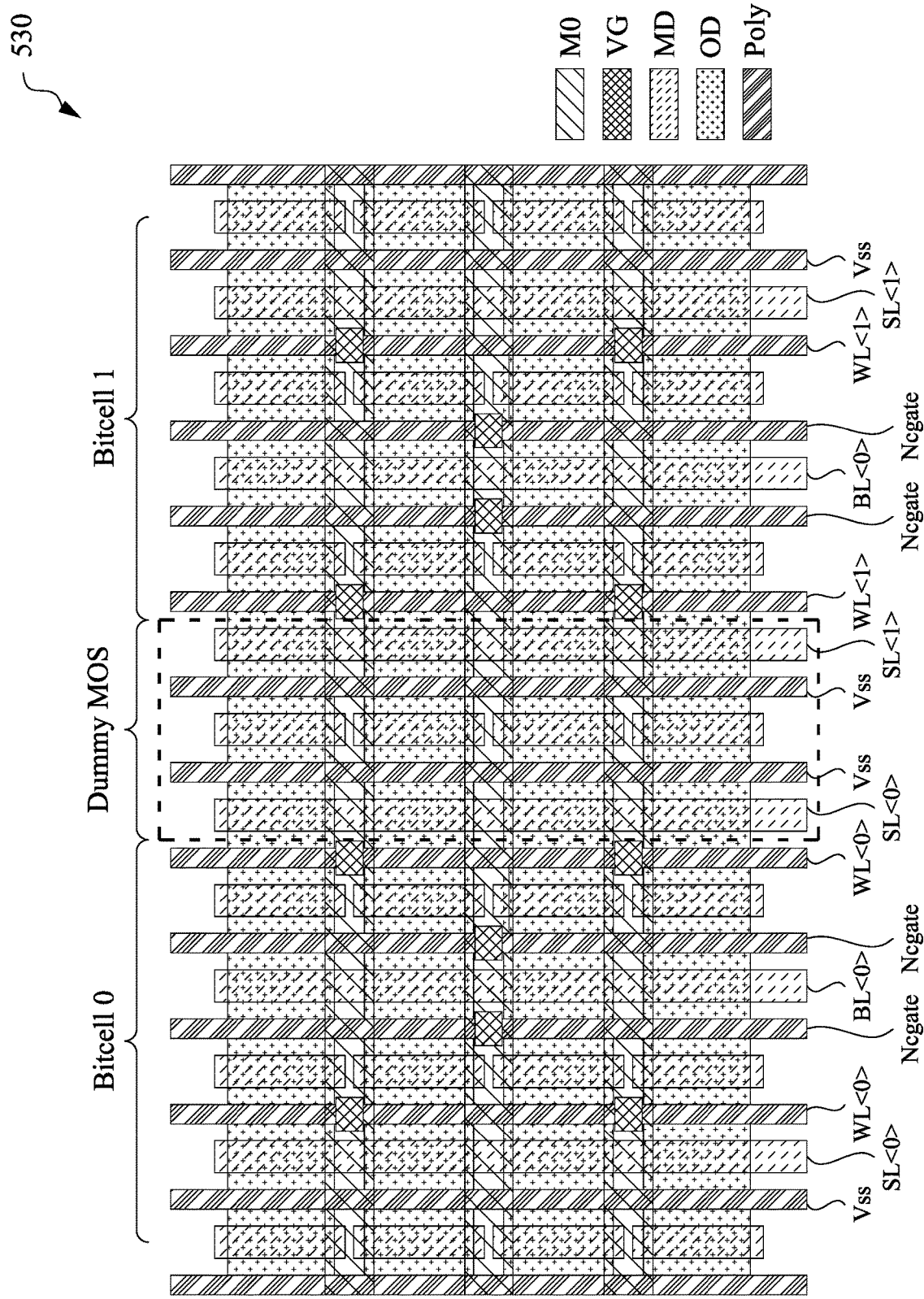
FIG. 5B illustrates a layout of the circuit of exemplary bitcells illustrated in FIG. 5A, in accordance with some embodiments.

FIG. 5B illustrates a layout 530 of circuit 500 of the exemplary bitcells illustrated in FIG. 5A, in accordance with some embodiments. More particularly, layout 530 includes Bitcells 0 and 1 corresponding to Bitcells 0 and 1 in FIG. 5A. Layout 530 is an exemplary layout of circuit 500 (FIG. 5A) with nanosheet transistors in, for example, a 3 nm semiconductor process. Layout details of each of Bitcells 0 and 1 (FIG. 5B) are similar to layout 420, as described above with reference to FIG. 4B. NMOS transistors 514-1 to 514-8 and 524-1 to 524-8 are dummy MOS transistors in the middle of layout 530. As shown in FIG. 5B, an OD layer of layout 530 continues across layouts of Bitcells 0 and 1. That is, an OD layer of Bitcell 0 is connected to an OD layer of Bitcell 1 so that Bitcells 0 and 1 (FIG. 5B) have OD coherence. The OD coherence of Bitcells 0 and 1 is defined as the OD layers (i.e., active regions) of Bitcells 0 and 1 having a common electrical reference, such as a common voltage reference or a semiconductor characteristic. When Bitcells 0 and 1 operate in the same condition (e.g., input signals of the same voltages), Bitcells 0 and 1 should operate significantly similarly or the same to each other.

Figure 6A:
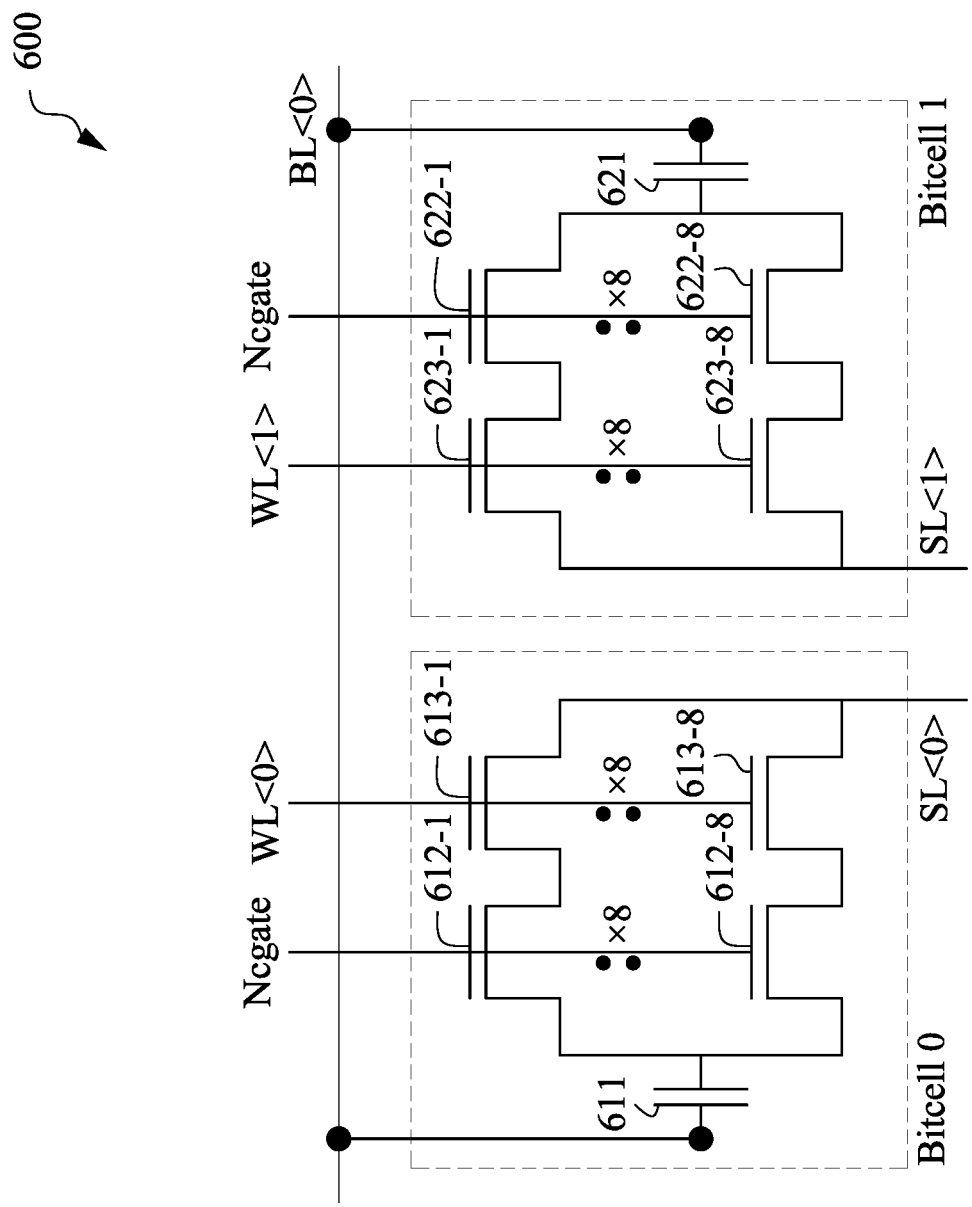
FIG. 6A illustrates a circuit of exemplary bitcells, in accordance with some embodiments.

FIG. 6A illustrates a circuit 600 of exemplary bitcells, in accordance with some embodiments. Circuit 600 includes Bitcells 0 and 1. Bitcell 0 includes a capacitor 611 and NMOS transistors 612-1 to 612-8 and 613-1 to 613-8 corresponding to capacitor 411 and NMOS transistors 412-1 to 412-8 and 413-1 to 413-8 of circuit 400 in FIG. 4A. Bitcell 1 includes a capacitor 621 and NMOS transistors 622-1 to 622-8 and 623-1 to 623-8 corresponding to capacitor 411 and NMOS transistors 412-1 to 412-8 and 413-1 to 413-8 of circuit 400 in FIG. 4A.

Bitcell 0 is coupled to a bitline BL<0>, a wordline WL<0>, a control line Ncgate, and a source line SL<0>. Bitcell 1 is coupled to bitline BL<0>, a wordline WL<1>, control line Ncgate, and a source line SL<1>. Bitcells 0 and 1 operate like Bitcells 00 and 10 (FIG. 2) or Bitcells 0 and 1 (FIG. 5A).

As shown in FIG. 6A, Bitcells 0 and 1 do not have dummy NMOS transistors and are separate from each other. Sources of NMOS transistors 613-1 to 613-8 are coupled to source line SL<0>. Sources of NMOS transistors 623-1 to 623-8 are coupled to source line SL<1>. A controller, e.g., control logic circuit 110 and/or address decoder 120 (FIG. 1), is configured to separately provide a first source-line signal of 0 volts or $V_{SL}$ volts to source line SL<0> and a second source-line signal of 0 volts or $V_{SL}$ volts to source line SL<1> in a programming mode.

Figure 6B:
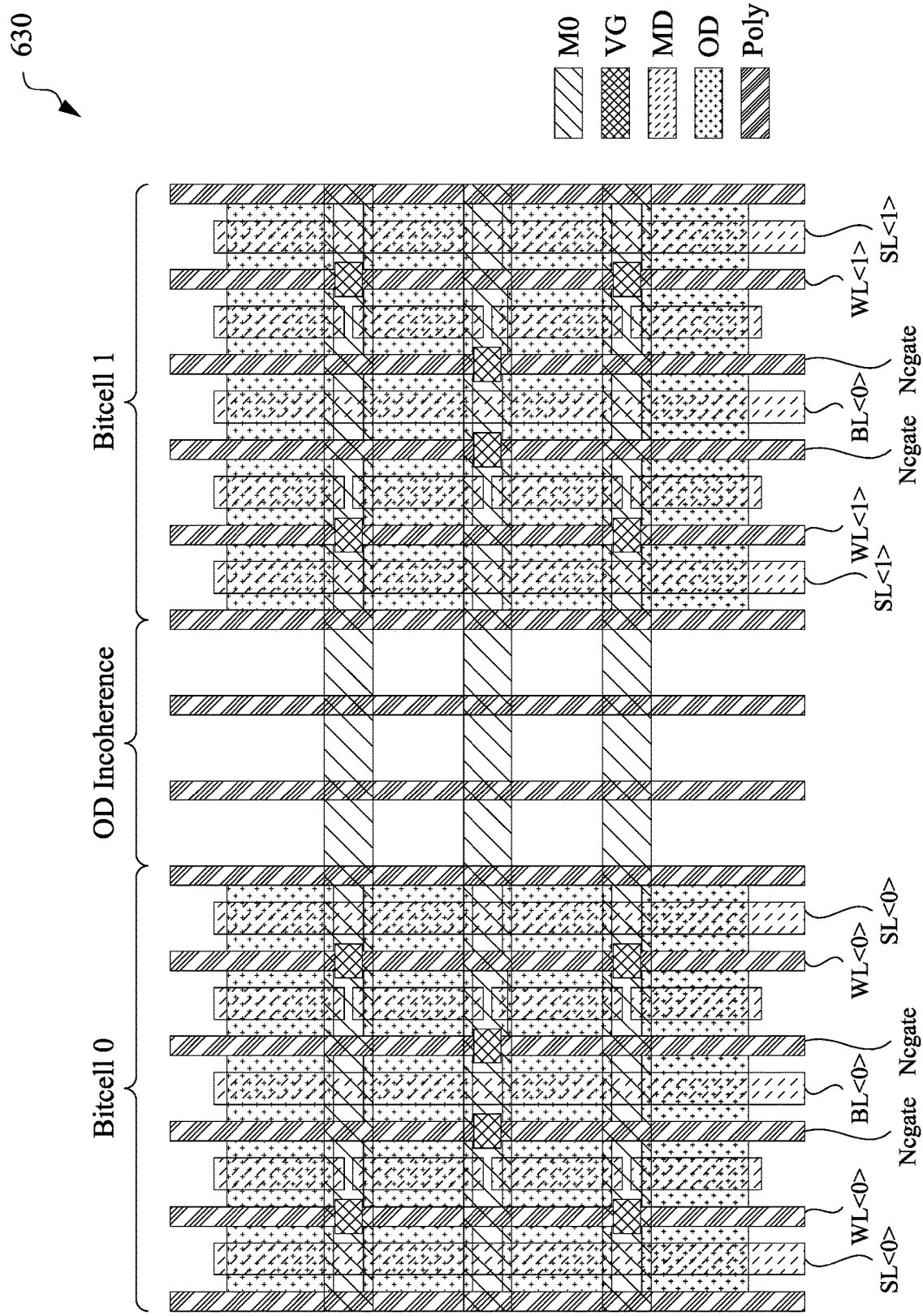
FIG. 6B illustrates a layout of the circuit of exemplary bitcells illustrated in FIG. 6A, in accordance with some embodiments.

FIG. 6B illustrates a layout 630 of circuit 600 of the exemplary bitcells illustrated in FIG. 6A, in accordance with some embodiments. More particularly, layout 630 includes Bitcells 0 and 1 corresponding to Bitcells 0 and 1 in FIG. 6A. Layout 630 is an exemplary layout of circuit 600 (FIG. 6A) with nanosheet transistors in, for example, a 3 nm semiconductor process. Layout details of each of Bitcells 0 and 1 (FIG. 6B) are similar to layout 420 (FIG. 4B), excluding layout regions 424-1 and 424-2. As shown in FIG. 6B, an OD layer of Bitcell 0 is separate from, i.e., not connected with, an OD layer of Bitcell 1. Bitcells 0 and 1 are OD incoherent. That is, Bitcells 0 and 1 (FIG. 6B) have OD incoherence. The OD incoherence of Bitcells 0 and 1 is defined as the OD layers (i.e., active regions) of Bitcells 0 and 1 not having a common electrical reference, such as a common voltage reference or a semiconductor characteristic. When Bitcells 0 and 1 operate in the same condition (e.g., input signals of the same voltages), Bitcells 0 and 1 may not operate significantly similarly or the same to each other.

In some embodiments, Bitcells 0 and 1 with OD incoherence may be implemented in some semiconductor manufacturing processes, such as 16 nm or above semiconductor processes.

Figure 7A:
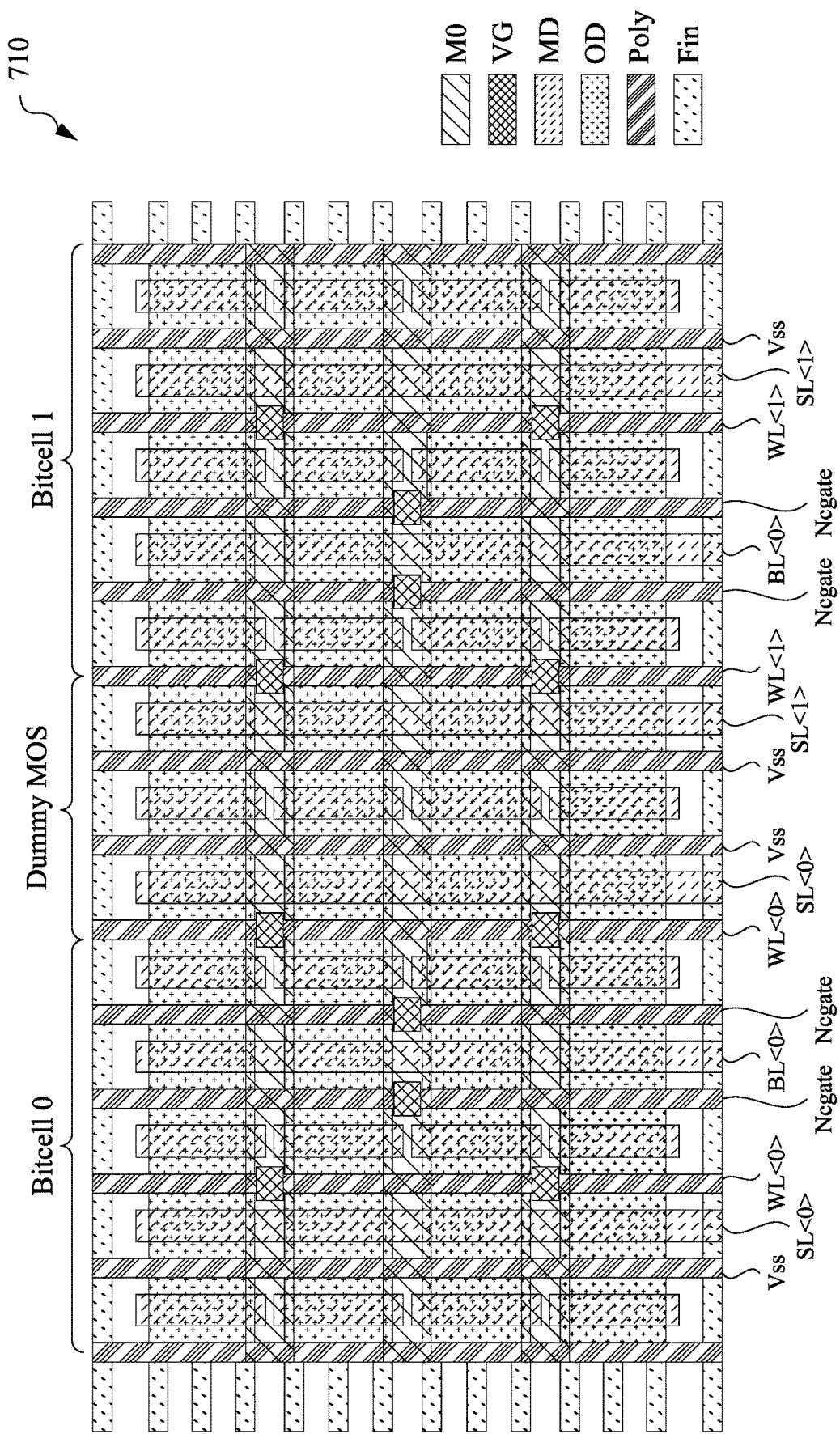
FIG. 7A illustrates a layout of the circuit of exemplary bitcells illustrated in FIG. 5A, in accordance with some embodiments.

FIG. 7A illustrates a layout 710 of circuit 500 of the exemplary bitcells illustrated in FIG. 5A, in accordance with some embodiments. More particularly, layout 710 is an exemplary layout of circuit 500 (FIG. 5A) with fin field-effect transistors (FinFETs) in, for example, 5 and 7 nm semiconductor processes. Layout 710 includes a metal zero (M0) level, a via over gate (VG) level, a metal diffusion (MD) level, an oxide diffusion (OD) level, and a polysilicon (Poly) level in three-fin transistor structure.

Layout 710 includes Bitcells 0 and 1 corresponding to Bitcells 0 and 1 in FIG. 5A. Layout details of each of Bitcells 0 and 1 (FIG. 7A) are similar to layout 420, excluding layout regions 424-1 and 424-2 but further including a three-fin transistor structure. As shown in FIG. 7A, an OD layer of layout 710 continues across layouts of Bitcells 0 and 1. That is, an OD layer of Bitcell 0 is connected to an OD layer of Bitcell 1 through dummy MOS transistors in the middle of layout 710. As a result, Bitcells 0 and 1 (FIG. 7A) have OD coherence.

Figure 7B:
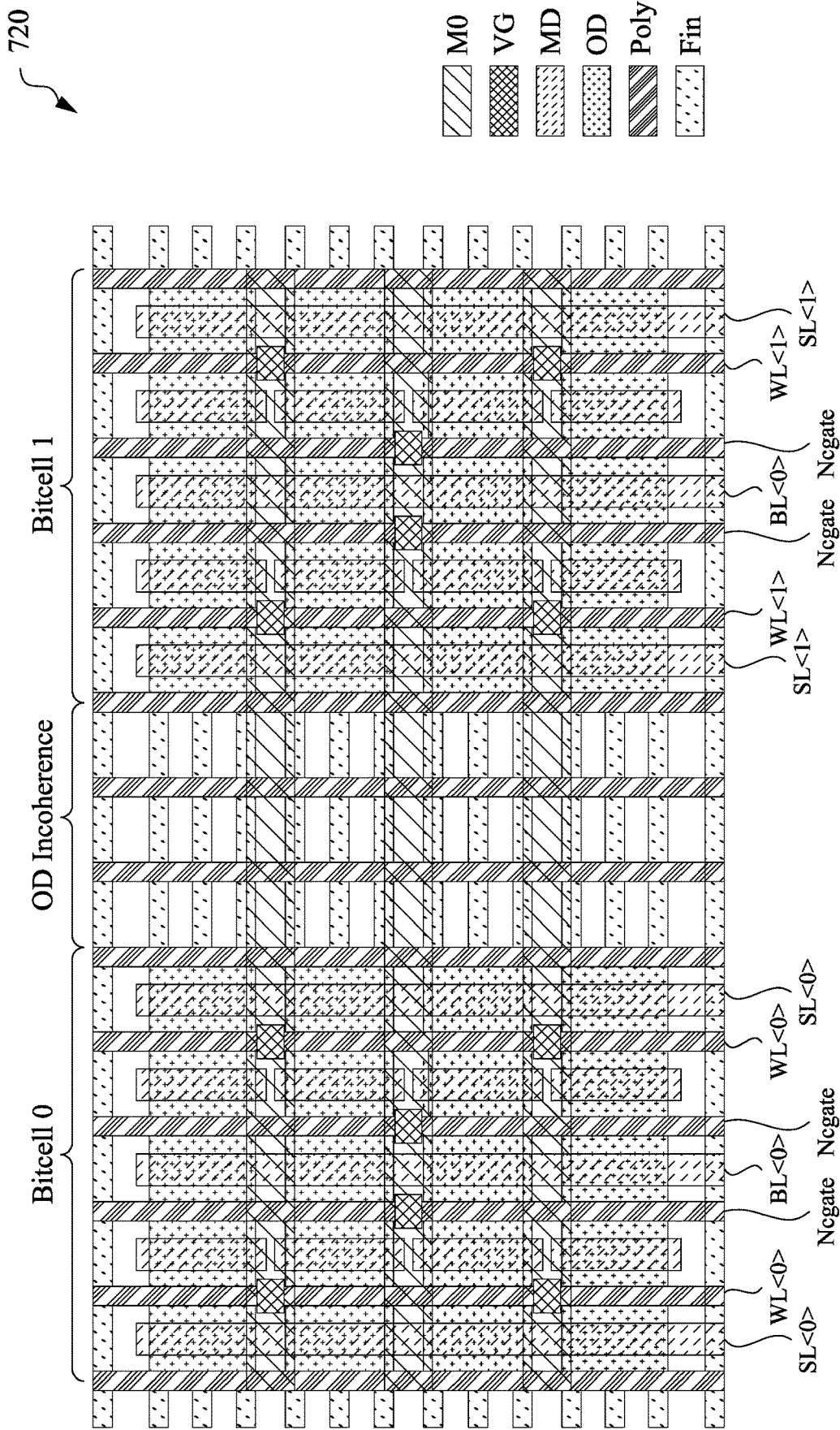
FIG. 7B illustrates a layout of the circuit of exemplary bitcells illustrated in FIG. 6A, in accordance with some embodiments.

FIG. 7B illustrates a layout 720 of circuit 600 of the exemplary bitcells illustrated in FIG. 6A, in accordance with some embodiments. More particularly, layout 720 is an exemplary layout of circuit 600 (FIG. 6A) with a fin field-effect transistors (FinFETs) in, for example, 5 and 7 nm semiconductor processes. Layout 720 includes a metal zero (M0) level, a via over gate (VG) level, a metal diffusion (MD) level, an oxide diffusion (OD) level (i.e., an active layer), and a polysilicon (Poly) level in three-fin transistor structure.

Layout 720 includes Bitcells 0 and 1 corresponding to Bitcells 0 and 1 in FIG. 6A. Layout details of each of Bitcells 0 and 1 (FIG. 7B) are similar to layout 420, excluding layout regions 424-1 and 424-2 but further including a three-fin transistor structure. As shown in FIG. 7B, an OD layer of Bitcell 0 is separate from, i.e., not connected to, an OD layer of Bitcell 1. Bitcells 0 and 1 are OD incoherent. That is, Bitcells 0 and 1 (FIG. 7B) have OD incoherence. Bitcells 0 and 1 with OD incoherence may be implemented by FinFETs in some semiconductor manufacturing processes, such as 5-7 nm or above semiconductor processes.

Figure 8A:
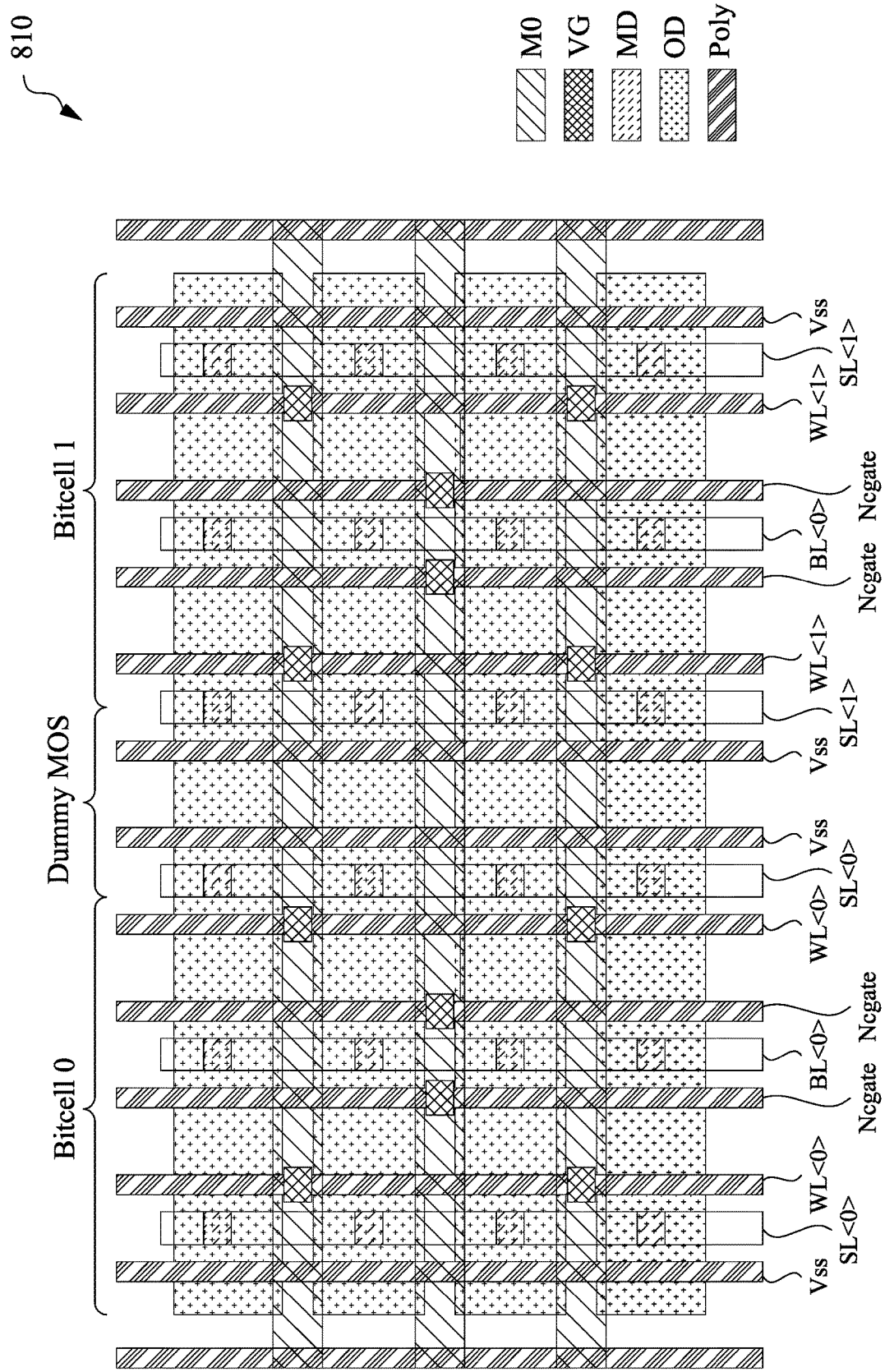
FIG. 8A illustrates a layout of the circuit of exemplary bitcells illustrated in FIG. 5A, in accordance with some embodiments.

FIG. 8A illustrates a layout 810 of circuit 500 of the exemplary bitcells illustrated in FIG. 5A, in accordance with some embodiments. More particularly, layout 810 is an exemplary layout of circuit 500 (FIG. 5A) by planar processes. Layout 810 includes a metal zero (M0) level, a via over gate (VG) level, a metal diffusion (MD) level, an oxide diffusion (OD) level (i.e., an active layer), and a polysilicon (Poly) level.

Layout 810 includes Bitcells 0 and 1 corresponding to Bitcells 0 and 1 in FIG. 5A. As shown in FIG. 8A, an OD layer of layout 810 continues across layouts of Bitcells 0 and 1. That is, an OD layer of Bitcell 0 is connected to an OD layer of Bitcell 1 through dummy MOS transistors in the middle of layout 810. Bitcells 0 and 1 (FIG. 8A) have OD coherence. Bitcells 0 and 1 with OD coherence may be implemented by planar processes, such as 16 nm or above semiconductor processes.

Figure 8B:
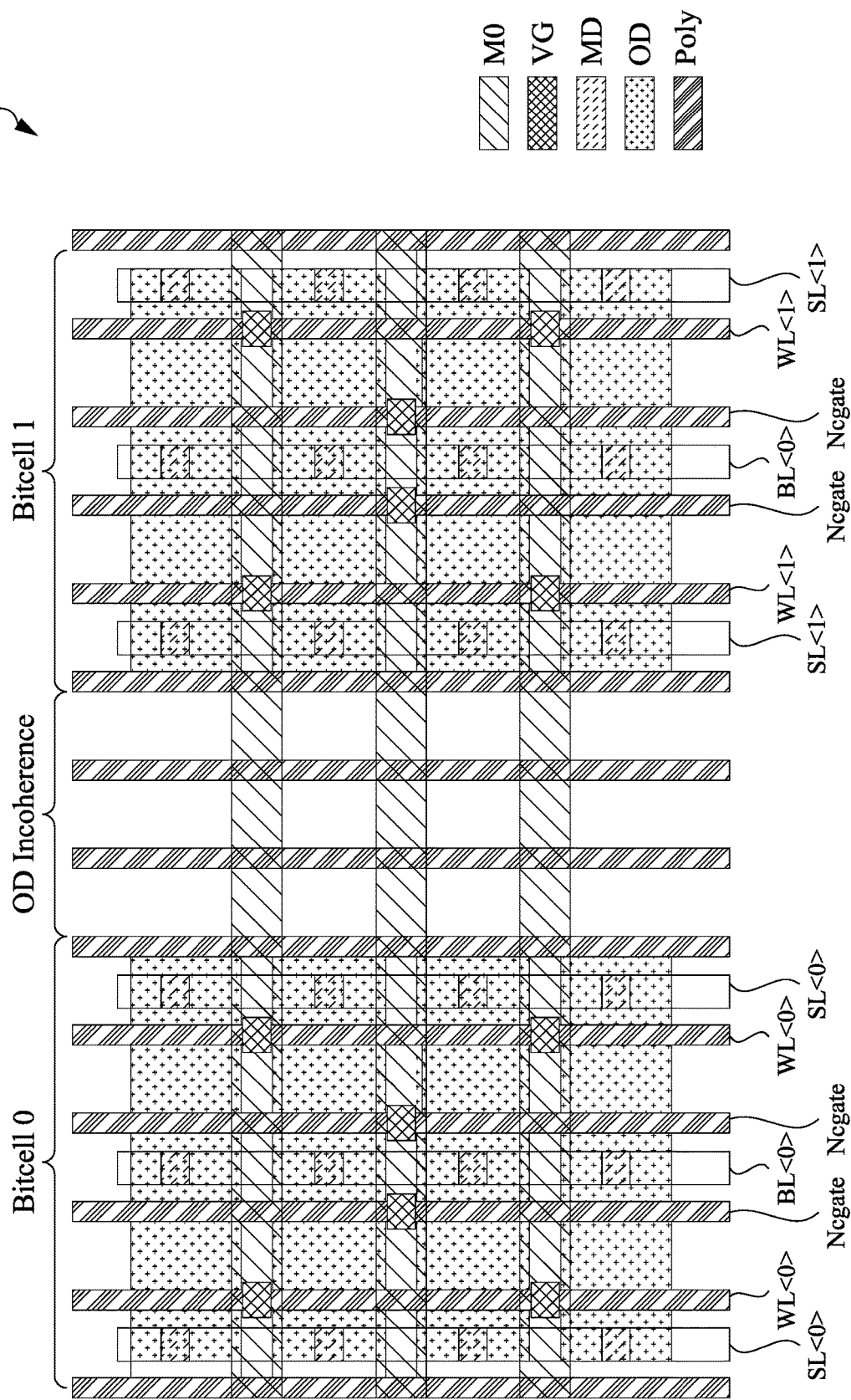
FIG. 8B illustrates a layout of the circuit of exemplary bitcells illustrated in FIG. 6A, in accordance with some embodiments.

FIG. 8B illustrates a layout 820 of circuit 600 of the exemplary bitcells illustrated in FIG. 6A, in accordance with some embodiments. More particularly, layout 820 is an exemplary layout of circuit 600 (FIG. 6A) by planar processes. Layout 820 includes a metal zero (M0) level, a via over gate (VG) level, a metal diffusion (MD) level, an oxide diffusion (OD) level (i.e., an active layer), and a polysilicon (Poly) level.

Layout 820 includes Bitcells 0 and 1 corresponding to Bitcells 0 and 1 in FIG. 6A. As shown in FIG. 8B, an OD layer of Bitcell 0 is separate from, i.e., not connected to, an OD layer of Bitcell 1. Bitcells 0 and 1 are OD incoherent. That is, Bitcells 0 and 1 (FIG. 8B) have OD incoherence. Bitcells 0 and 1 with OD incoherence may be implemented by planar processes, such as 16 nm or above semiconductor processes.

Figure 9A:
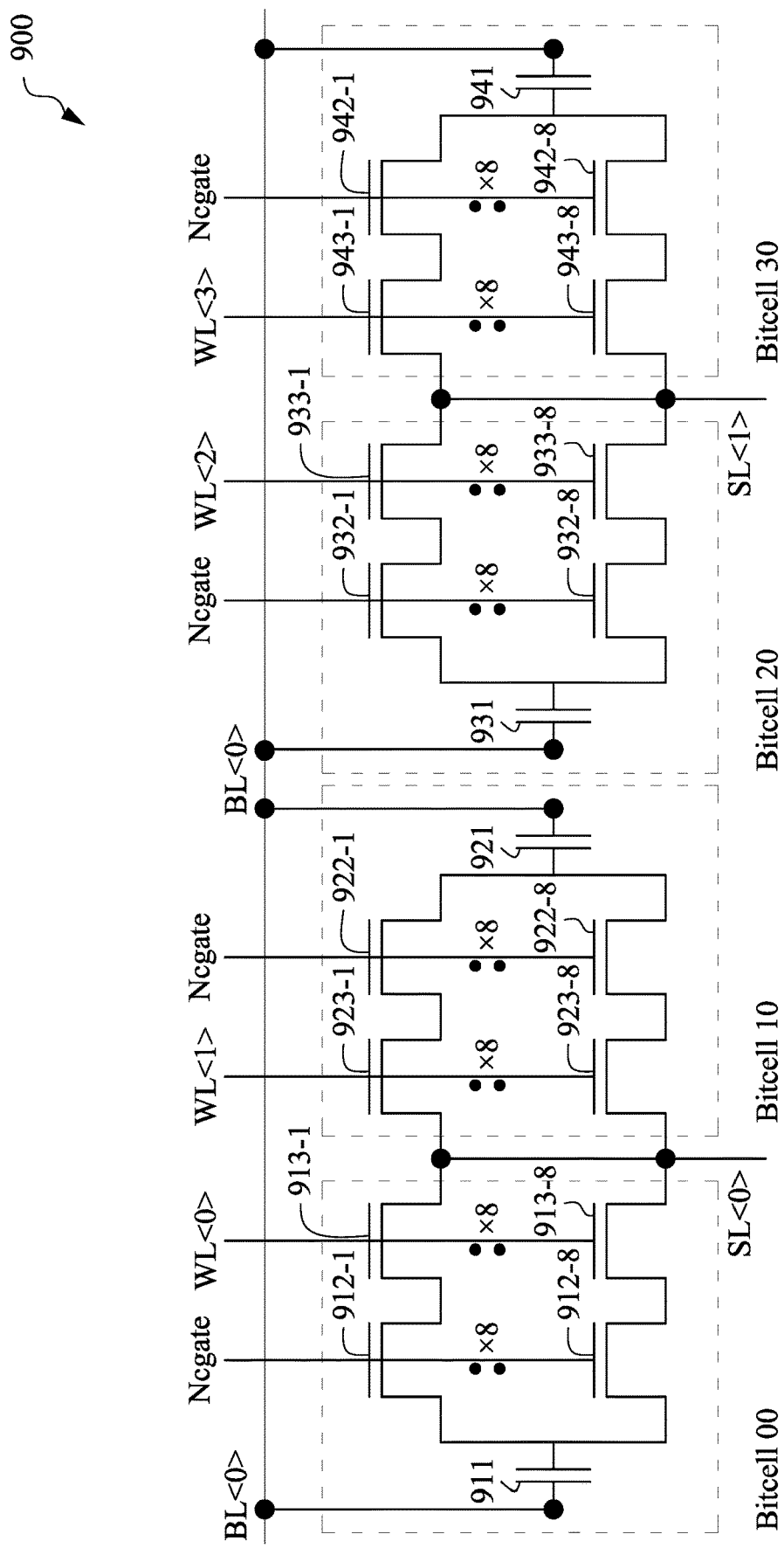
FIG. 9A illustrates a circuit of exemplary bitcells, in accordance with some embodiments.

FIG. 9A illustrates a circuit 900 of exemplary bitcells, in accordance with some embodiments. Circuit 900 may be implemented in bitcell array 143 of memory device 100 (FIG. 1). A controller (not shown) is configured to control bitcells in circuit 900 as described herein. The controller may be implemented by control logic circuit 110 and/or address decoder 120 of memory device 100 (FIG. 1). As shown in FIG. 9A, circuit 900 includes Bitcells 00, 10, 20, and 30. Bitcell 00 includes a capacitor 911 and NMOS transistors 912-1 to 912-8 and 913-1 to 913-8 corresponding to capacitor 411 and NMOS transistors 412-1 to 412-8 and 413-1 to 413-8 of circuit 400 in FIG. 4A. Bitcell 10 includes a capacitor 921 and NMOS transistors 922-1 to 922-8 and 923-1 to 923-8 corresponding to capacitor 411 and NMOS transistors 412-1 to 412-8 and 413-1 to 413-8 of circuits 400 in FIG. 4A. Bitcell 20 includes a capacitor 931 and NMOS transistors 932-1 to 932-8 and 933-1 to 933-8 corresponding to capacitor 411 and NMOS transistors 412-1 to 412-8 and 413-1 to 413-8 of circuit 400 in FIG. 4A. Bitcell 30 includes a capacitor 941 and NMOS transistors 942-1 to 942-8 and 943-1 to 943-8 corresponding to capacitor 411 and NMOS transistors 412-1 to 412-8 and 413-1 to 413-8 of circuit 400 in FIG. 4A.

Bitcell 00 is coupled to a bitline BL<0>, a wordline WL<0>, a control line Ncgate, and a source line SL<0>. Bitcell 10 is coupled to bitline BL<0>, a wordline WL<1>, control line Ncgate, and source line SL<0>. As shown in FIG. 9A, Bitcells 00 and 10 are coupled to the same source line SL<0>. A controller, e.g., control logic circuit 110 and/or address decoder 120 (FIG. 1), may be configured to provide a source-line signal of 0 volts or $V_{SL}$ volts to source line SL<0> for both Bitcells 00 and 10 in a programming mode, as described above for circuit 200 with reference to FIGS. 2 and 3.

Bitcell 20 is coupled to bitline BL<0>, a wordline WL<2>, control line Ncgate, and a source line SL<1>. Bitcell 30 is coupled to bitline BL<0>, a wordline WL<3>, control line Ncgate, and source line SL<1>. As shown in FIG. 9A, Bitcells 20 and 30 are coupled to the same source line SL<1>. The controller, e.g., control logic circuit 110 and/or address decoder 120 (FIG. 1), may be configured to provide a source-line signal of 0 volts or $V_{SL}$ volts to source line SL<1> for both Bitcells 20 and 30 in a programming mode, as described above for circuit 200 with reference to FIGS. 2 and 3.

In some embodiments, a memory device includes a plurality of bitcells coupled to a plurality of bitlines, a plurality of wordlines, a plurality of source lines, and a control line. A plurality of the bitcells are coupled to one of the bitlines. The plurality of the bitcells are coupled to one of the source lines. The one of the source lines is configured for a source-line signal of a voltage level, the voltage level being higher than a ground level of voltage.

For example, memory device 100 (FIG. 1) may include 64×16 bitcells in bitcell array 143. The bitcells are coupled to a plurality of bitlines BL<i>, a plurality of wordlines WL<j>, a plurality of source lines SL<k>, and a control line Ncgate, where i=0 to 15, j=0 to 63, and k=0 to 31. Each bitline is coupled to 64 bitcells. On bitline BL<0>, bitcells coupled to wordlines WL<0> to WL<3> are implemented as Bitcells 00, 10, 20, and 30 in FIG. 9A. Bitcells 00 and 10 are coupled to bitline BL<0> and to source line SL<0>. Source line SL<0> is configured for a first source-line signal of $V_{SL}$ volts or 0 volts, where $V_{SL} > V_{SS}$. Bitcells 20 and 30 are coupled to bitline BL<0> and to source line SL<1>. Source line SL<1> is configured for a second source-line signal of $V_{SL}$ volts or 0 volts, where $V_{SL} > V_{SS}$.

Figure 9B:
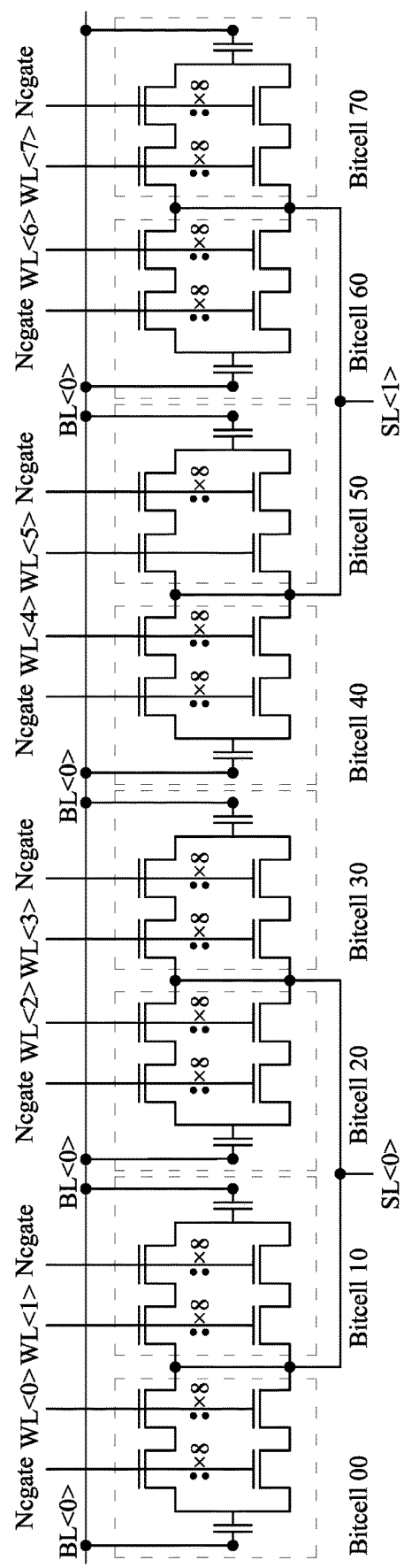
FIG. 9B illustrates a circuit of exemplary bitcells, in accordance with some embodiments.

FIG. 9B illustrates a circuit 950 of exemplary bitcells, in accordance with some embodiments. Circuit 950 may be implemented in bitcell array 143 of memory device 100 (FIG. 1). A controller (not shown) is configured to control bitcells in circuit 950 as described herein. The controller may be implemented by control logic circuit 110 and/or address decoder 120 of memory device 100 (FIG. 1). As shown in FIG. 9B, circuit 950 includes Bitcells 00, 10, 20, 30, 40, 50, 60, and 70. Bitcells 00 to 70 each include a capacitor, first eight NMOS transistors, and second eight NMOS transistors corresponding to capacitor 411 and NMOS transistors 412-1 to 412-8 and 413-1 to 413-8 of circuit 400 in FIG. 4A.

Bitcell 00 is coupled to a bitline BL<0>, a wordline WL<0>, a control line Ncgate, and a source line SL<0>. Bitcell 10 is coupled to bitline BL<0>, a wordline WL<1>, control line Ncgate, and source line SL<0>. Bitcell 20 is coupled to bitline BL<0>, a wordline WL<2>, control line Ncgate, and source line SL<0>. Bitcell 30 is coupled to bitline BL<0>, a wordline WL<3>, control line Ncgate, and source line SL<0>. As shown in FIG. 9A, Bitcells 00, 10, 20, and 30 are coupled to the same source line SL<0>. A controller, e.g., control logic circuit 110 and/or address decoder 120 (FIG. 1), may be configured to provide a source-line signal of $V_{SL}$ volts or 0 volts to source line SL<0> for Bitcells 00 to 30 in a programming mode, as described above for circuit 200 with reference to FIGS. 2 and 3.

Bitcell 40 is coupled to bitline BL<0>, a wordline WL<4>, control line Ncgate, and a source line SL<1>. Bitcell 50 is coupled to bitline BL<0>, a wordline WL<5>, control line Ncgate, and source line SL<1>. Bitcell 60 is coupled to bitline BL<0>, a wordline WL<6>, control line Ncgate, and source line SL<1>. Bitcell 70 is coupled to bitline BL<0>, a wordline WL<7>, control line Ncgate, and source line SL<1>. As shown in FIG. 9A, Bitcells 40, 50, 60, and 70 are coupled to the same source line SL<1>. The controller, e.g., control logic circuit 110 and/or address decoder 120 (FIG. 1), may be configured to provide a source-line signal of $V_{SL}$ volts or 0 volts to source line SL<1> for Bitcells 40 to 70 in a programming mode, as described above for circuit 200 with reference to FIGS. 2 and 3.

In some embodiments, three bitcells on a same bitline are coupled to a same source line. The controller may be configured to provide a source-line signal of $V_{SL}$ volts or 0 volts to the source line for the three bitcells in a programming mode, as described above for circuit 200 with reference to FIGS. 2 and 3. In some embodiments, five, six, seven, eight, or more bitcells on a same bitline are coupled to a same source line. The controller may be configured to provide a source-line signal of $V_{SL}$ volts or 0 volts to the source line for the bitcells in a programming mode, as described above for circuit 200 with reference to FIGS. 2 and 3.

Figure 10A:
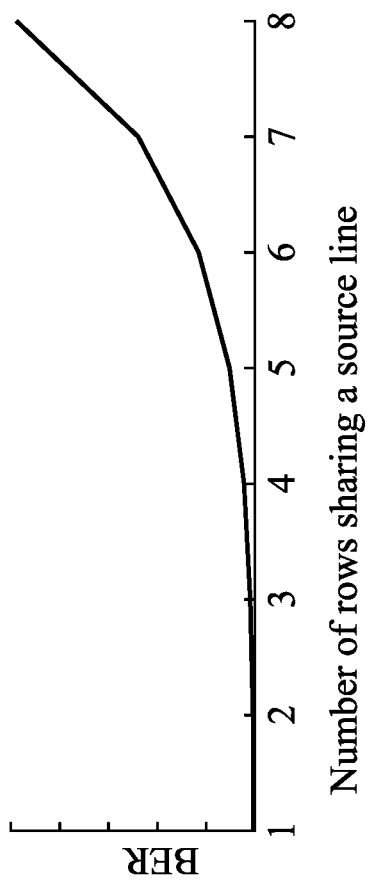
FIG. 10A illustrates an exemplary relationship between bit error rates (BERs) and numbers of rows of bitcells sharing a source-line signal, in accordance with some embodiments.

FIG. 10A illustrates an exemplary relationship between bit error rate (BER) and numbers of rows of bitcells sharing a source-line signal, in accordance with some embodiments. In some embodiments, a memory device includes wordlines and bitlines of a bitcell array arranged in rows and columns, e.g., in a 64×16 array. A number of bitcells on a bitline (i.e., the bitcells on different rows but on a same column in the array) are coupled to a same source line and share a source-line signal. Circuit 200 (FIG. 2) (as viewed after rotating 90 degrees counterclockwise) is an example of the number of rows of bitcells equal to one. That is, only one row's bitcell (e.g., Bitcell 00 on one row) on one bitline (e.g., BL<0>) is coupled to a source line (e.g., SL<0>).

Circuit 900 (FIG. 9A) (as viewed after rotating 90 degrees counterclockwise) is an example of the number of rows of bitcells equal to two. That is, two rows' bitcells (e.g., Bitcells 00 and 10 on two rows) on one bitline (e.g., BL<0>) are coupled to and share a source line (e.g., SL<0>). Circuit 950 (FIG. 9B) (as viewed after rotating 90 degrees counterclockwise) is an example of the number of rows of bitcells equal to four. That is, four rows' bitcells (e.g., Bitcells 00, 10, 20, and 30 on four rows) on one bitline (e.g., BL<0>) are coupled to and share a source line (e.g., SL<0>).

When each bitcell (i.e., each row) on a bitline (e.g., BL<0>) is coupled to a source line, a controller can be configured to supply a source-line signal of $V_{SL}$ volts to the bitcell to avoid a write disturbance error. That is, the controller can be configured to supply source-line signals of $V_{SL}$ volts to all half-selected bitcells in a programming mode and thereby avoid all write disturbance errors. As shown in FIG. 10A, a BER for one row sharing a source line is 0%.

When the number of rows sharing a source line increases, the controller may not be able to supply source-line signals of $V_{SL}$ volts to all half-selected bitcells in the programming mode because of control conflicts. For example, a control conflict may occur when a first of bitcells sharing a source line is half-selected but a second of the bitcells is selected. The controller is configured to provide a source-line signal of 0 volts to the shared source line for programming the selected bitcell correctly. The controller is therefore unable to provide a source-line signal of $V_{SL}$ volts to the shared source line for the half-selected bitcell at the same time. As a result, a write disturbance error may occur in the half-selected bitcell. When more rows of bitcells share a source line, the control conflict occurs on more half-selected bitcells, and the BER also increases. As shown in FIG. 10A, BER increases as more rows share a source line.

Figure 10B:
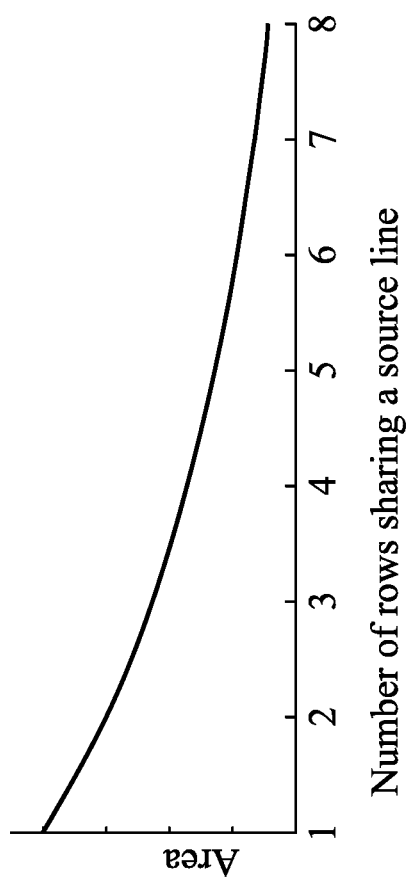
FIG. 10B illustrates an exemplary relationship between circuit area and number of rows of bitcells sharing a source-line signal, in accordance with some embodiments.

FIG. 10B illustrates an exemplary relationship between circuit area and number of rows of bitcells sharing a source-line signal, in accordance with some embodiments. When each bitcell (i.e., each row) on a bitline (e.g., BL<0>) is coupled to a source line, the memory device requires a plurality of source lines. The plurality of source lines result in a first circuit area. Moreover, since the controller is required to supply source-line signals of $V_{SL}$ volts to all half-selected bitcells in a programming mode, a part the controller is considered as a second circuit area for controlling the source-line signals. The first and second circuit areas amount to a total area required for controlling source lines.

As shown in FIG. 10B, an amount of area is required when each bitcell (i.e., each row) on a bitline is coupled to a source line.

When the number of rows sharing a source line increases, required source lines decrease. Required circuit areas for the source lines also decrease. The controller is also required to control a reduced number of source-line signals in the programming mode. Less circuit area of the controller is needed for controlling the source-line signals. Thus, as shown in FIG. 10B, required circuit area decreases when the number of rows sharing a source line increases.

Figure 11:
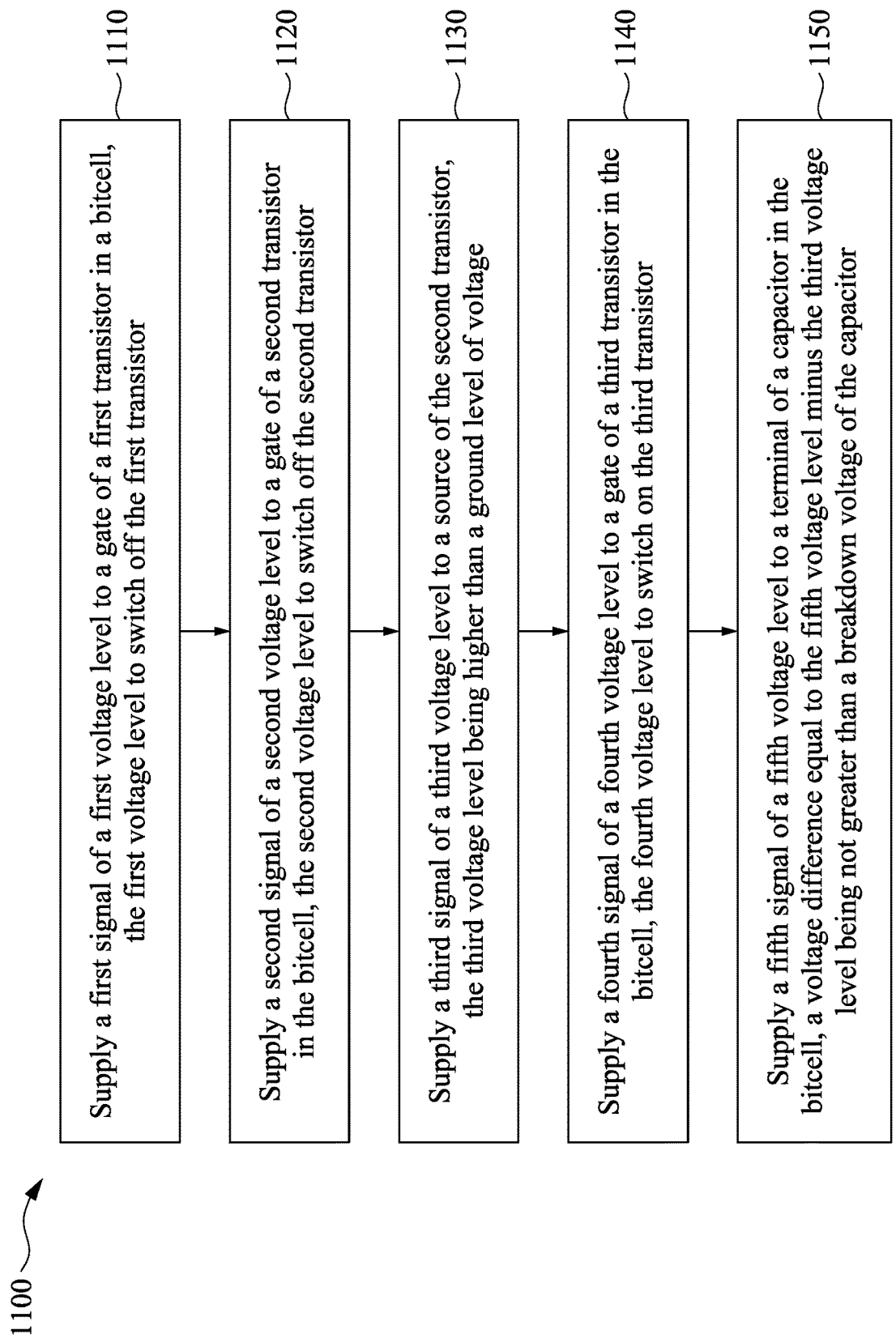
FIG. 11 is a flowchart of an exemplary method, in accordance with some embodiments.

FIG. 11 is a flowchart of an exemplary method 1100, in accordance with some embodiments. Method 1100 may be practiced by circuits disclosed and illustrated in the present disclosure. Method 1100 includes supplying a first signal of a first voltage level to a gate of a first transistor in a bitcell, the first voltage level to switch off the first transistor (step 1110); supplying a second signal of a second voltage level to a gate of a second transistor in the bitcell, the second voltage level to switch off the second transistor (step 1120); supplying a third signal of a third voltage level to a source of the second transistor, the third voltage level being higher than a ground level of voltage (step 1130); supplying a fourth signal of a fourth voltage level to a gate of a third transistor in the bitcell, the fourth voltage level to switch on the third transistor (step 1140); and supplying a fifth signal of a fifth voltage level to a terminal of a capacitor in the bitcell, a voltage difference equal to the fifth voltage level minus the third voltage level being not greater than a breakdown voltage of the capacitor (step 1150).

Step 1110 includes supplying a first signal of a first voltage level to a gate of a first transistor in a bitcell. The first voltage level switches off the first transistor. For example, memory device 100 includes bitcell array 143 (FIG. 1). Bitcell array 143 may include Bitcells 00, 10, 01, and 11 (FIG. 2). Bitcell 01 includes capacitor 221 and transistors 222, 223, and 224. When memory device 100 is in a programming mode, control logic circuit 110 and address decoder 120 are configured to select and program, for example, Bitcell 11 by supplying a bitline signal of $V_{QPS}$ volts to bitline BL<1> (i.e., BL<1>=$V_{QPS}$), a wordline signal of $V_{WL}$ volts to wordline WL<1> (i.e., WL<1>=$V_{WL}$), and a control signal of $V_{Ncgate}$ volts to control line Ncgate (i.e., Ncgate=$V_{Ncgate}$). At the same time, control logic circuit 110 and address decoder 120 are configured to supply a wordline signal of 0 volts to wordline WL<0> (i.e., WL<0>=0) because bitcells on WL<0> are not selected.

With BL<1>=$V_{QPS}$, WL<0>=0, and Ncgate=$V_{Ncgate}$ (FIG. 3), control logic circuit 110 and address decoder 120 are configured to half select Bitcell 01 (FIG. 3). Control logic circuit 110 and address decoder 120 are configured to supply a signal of a voltage level of $V_{SS}$ volts to the gate of transistor 224 in Bitcell 01 (FIG. 3). The voltage level of $V_{SS}$ volts is a negative power level and switches off transistor 224.

Step 1120 includes supplying a second signal of a second voltage level to a gate of a second transistor in the bitcell. The second voltage level switches off the second transistor. In the example above for step 1110, control logic circuit 110 and address decoder 120 are configured to supply a wordline signal of 0 volts to wordline WL<0> (i.e., WL<0>=0). Wordline WL<0> is coupled to the gate of transistor 223 in Bitcell 01 (FIG. 3). The voltage level of 0 volts switches off transistor 223.

Step 1130 includes supplying a third signal of a third voltage level to a source of the second transistor. The third voltage level is higher than a ground level of voltage. In the example above for step 1110, control logic circuit 110 and address decoder 120 are configured to supply a source-line signal of $V_{SL}$ volts to a source of transistor 223 (FIG. 3) (i.e., SL<0>=$V_{SL}$). The voltage level of $V_{SL}$ is $V_{DD}$ or $V_{DD}/2$, which is higher that a ground level of voltage.

Step 1140 includes supplying a fourth signal of a fourth voltage level to a gate of a third transistor in the bitcell. The fourth voltage level switches on the third transistor. In the example above for step 1110, control logic circuit 110 and address decoder 120 are configured to supply the fourth signal, i.e., a control signal, of the fourth voltage level, i.e., $V_{Ncgate}$ volts, to the gate of the third transistor, i.e., transistor 222 (i.e., Ncgate=$V_{Ncgate}$) in Bitcell 01 (FIG. 3). The voltage level of $V_{Ncgate}$ volts (FIG. 3) is a high-level signal and switches on transistor 222.

Step 1150 includes supplying a fifth signal of a fifth voltage level to a terminal of a capacitor in the bitcell. A voltage difference equal to the fifth voltage level minus the third voltage level is not greater than a breakdown voltage of the capacitor. In the example above for step 1110, control logic circuit 110 and address decoder 120 are configured to supply the fifth signal, i.e., a bitline signal, of the fifth voltage level, i.e., $V_{QPS}$ volts, to bitline BL<1> (i.e., BL<1>=$V_{QPS}$). Bitline BL<1> is coupled to a terminal of capacitor 221 in Bitcell 01 (FIG. 3). That is, control logic circuit 110 and address decoder 120 are configured to supply the signal of $V_{QPS}$ volts to the terminal of capacitor 221 in Bitcell 01 (FIG. 3). As explained above with reference to FIG. 3, the controller (e.g., control logic circuit 110 and address decoder 120) is configured to adjust both the voltage levels of $V_{QPS}$ (i.e., the fifth voltage level) and $V_{SL}$ (i.e., the third voltage level) so that the voltage difference $V_{QPS}-V_{SL}$ is not greater than $V_C$ (i.e., the breakdown voltage of capacitor 221), i.e., $V_{QPS}-V_{SL}$ $V_C$.

This disclosure relates to a memory circuit and its operation for avoiding write disturbance errors, reducing voltage stress, and enhancing programming performance. The memory circuit includes a plurality of bitcells. Source lines of the bitcells are respectively coupled to a controller of the memory circuit. The controller is configured to supply source-line signals of a voltage level of $V_{SL}$ volts (e.g., $V_{DD}$) to half-selected bitcells in a programming mode. The source-line signals of $V_{SL}$ avoid or reduce possible voltage stress across the half-selected bitcells in the programming mode. Thus, the controller can control the source-line signals to avoid or alleviate write disturbance errors in the memory circuit during the programming mode. Moreover, the controller can also increase the voltage level of $V_{QPS}$ on bitlines to enhance programming performance if the controller controls the voltage level of $V_{SL}$ to make $V_{QPS}-V_{SL}$ less than a breakdown voltage (e.g., $V_C$) of a capacitor in the bitcells.

In some embodiments, the bitcells may also include dummy transistors. The dummy transistors in two or more bitcells are coupled together; therefore, OD layers of the bitcells are coupled together to provide OD coherence required in advanced semiconductor processes, such as 2, 3, 5, and 7 nm processes.

One aspect of this disclosure relates to a memory circuit. The memory circuit includes a plurality of bitcells coupled to a plurality of bitlines, a plurality of wordlines, a plurality of source lines, and a control line. A first of the bitcells and a second of the bitcells are coupled to a first of the bitlines. The first bitcell is coupled to a first of the source lines. The second bitcell is coupled to a second of the source lines. The first source line is different from the second source line.

Another aspect of this disclosure relates to a memory device. The memory device includes a plurality of bitcells coupled to a bitline, a plurality of wordlines, a plurality of source lines, and a control line. Ones of the plurality of the bitcells are coupled to one of the source lines. The one of the source lines is configured for a source-line signal of a voltage level. The voltage level is higher than a ground level of voltage.

Still another aspect of this disclosure relates to a method for a memory circuit. The memory circuit includes a bitcell. The bitcell includes a first transistor and a second transistor. The method includes supplying a first signal of a first voltage level to a gate of the first transistor. The first voltage level switches off the first transistor. The method also includes supplying a second signal of a second voltage level to a gate of the second transistor. The second voltage level switches off the second transistor. The method also includes supplying a third signal of a third voltage level to a source of the second transistor. The third voltage level is higher than a ground level of voltage.

Specific examples of capacitors, transistors, layouts, and semiconductor processes have been provided. However, these examples are not intended to be limiting. Persons of ordinary skill will now understand that the embodiments herein can be practiced with equal effectiveness with components having other capacitors, transistors, layouts, and semiconductor processes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit, comprising:
a plurality of bitcells coupled to a plurality of bitlines, a plurality of wordlines, a plurality of source lines, and a control line; wherein:
a first of the bitcells and a second of the bitcells are coupled to a first of the bitlines;
the first bitcell is separately coupled to a first of the source lines and the control line; and
the second bitcell is separately coupled to a second of the source lines and the control line;
wherein:
the first source line is different from the second source line;
the first bitcell comprises a first transistor;
the second bitcell comprises a second transistor; and
the first transistor is coupled to the second transistor through a connection line, the connection line configured to float.

2. The memory circuit of claim 1, wherein:
the first bitcell is coupled to a first of the wordlines and to the control line; and
the second bitcell is coupled to a second of the wordlines and to the control line.

3. The memory circuit of claim 2, wherein:
the first transistor comprises a first gate coupled to a first power line for a first voltage level, the first voltage level to switch off the first transistor; and the second transistor comprises a second gate coupled to a second power line for a second voltage level, the second voltage level to switch off the second transistor.

4. The memory circuit of claim 3, wherein:
the first transistor comprises a first source, the first source configured to float; and
the second transistor comprises a second source, the second source configured to float.

5. The memory circuit of claim 3, wherein:
a third of the bitcells and a fourth of the bitcells are coupled to a second of the bitlines;
the third bitcell is coupled to the first source line;
the fourth bitcell is coupled to the second source line;
the third bitcell is separately coupled to the first source line and the control line; and
the fourth bitcell is separately coupled to the second source line and the control line.

6. The memory circuit of claim 5, wherein:
the third bitcell comprises a third transistor, the third transistor comprising a third gate coupled to the first power line for the first voltage level, the first voltage level to switch off the third transistor; and
the fourth bitcell comprises a fourth transistor, the fourth transistor comprising a fourth gate coupled to the second power line for the second voltage level, the second voltage level to switch off the fourth transistor.

7. The memory circuit of claim 6, wherein:
the connection line is a first connection line, and
the third transistor is coupled to the fourth transistor through a second connection line, the second connection line configured to float.

8. The memory circuit of claim 1, wherein the first bitcell comprises:
a capacitor coupled to the first bitline;
the first transistor coupled to the capacitor and the control line; and
a third transistor coupled to the first transistor, a first of the wordlines, and the first source line.

9. The memory circuit of claim 8, wherein the first bitcell further comprises:
a fourth transistor coupled to the third transistor and comprising:
a gate coupled to a power line for a voltage level, the voltage level to switch off the fourth transistor; and
a source configured to float.

10. The memory circuit of claim 8, wherein:
the first transistor comprises a first plurality of transistors coupled to the capacitor and the control line; and
the third transistor comprises a second plurality of transistors coupled to the first plurality of transistors, the first wordline, and the first source line.

11. The memory circuit of claim 1, wherein:
the first source line is configured for a source-line signal of a voltage level, the voltage level being higher than a ground level of voltage.

12. The memory circuit of claim 11, wherein:
the first bitcell comprises a capacitor;
the voltage level is a first voltage level;
the first bitline has a second voltage level;
a voltage difference equals the second voltage level minus the first voltage level; and
the voltage difference is not greater than a breakdown voltage of the capacitor.

13. The memory circuit of claim 1, wherein:
the first bitcell comprises a first oxide diffusion (OD) layer;
the second bitcell comprises a second OD layer; and
the first OD layer is connected to the second OD layer.

14. The memory circuit of claim 1, wherein:
the first bitcell comprises a first oxide diffusion (OD) layer;
the second bitcell comprises a second OD layer; and
the first OD layer is separate from the second OD layer.

15. A memory device, comprising:
a plurality of bitcells coupled to a bitline, a plurality of wordlines, a plurality of source lines, and a control line; wherein:
ones of the plurality of bitcells are coupled to one of the source lines and separately coupled to the control line; and
the one of the source lines is configured for a source-line signal of a voltage level higher than a ground level of voltage,
wherein:
a first one of the plurality of bitcells comprises a first transistor;
a second one of the plurality of bitcells comprises a second transistor; and
the first transistor is coupled to the second transistor through a connection line, wherein the connection line is not the bitline and is configured to float.

16. The memory device of claim 15, wherein:
the ones of the plurality of bitcells are a first plurality of the bitcells;
the one of the source lines is a first source line;
the source-line signal is a first source-line signal;
the voltage level is a first voltage level;
a second plurality of the bitcells are coupled to a second of the source lines; and
the second source line is configured for a second source-line signal of a second voltage level higher than the ground level of voltage.

17. The memory device of claim 16, wherein:
the first plurality of the bitcells are coupled to first ones of the plurality of the wordlines; and
the second plurality of the bitcells are coupled to second ones of the plurality of the wordlines.

18. A method for a memory circuit, wherein the memory circuit comprises a bitcell, the bitcell comprises a first transistor and a second transistor, and a drain of the first transistor is coupled to a source of the second transistor, the method comprising:
supplying a first signal of a first voltage level to a gate of the first transistor, the first voltage level to switch off the first transistor;
supplying a second signal of a second voltage level to a gate of the second transistor, the second voltage level to switch off the second transistor; and
supplying, from a source line, a third signal of a third voltage level to a connection point between the drain of the first transistor and the source of the second transistor, the third voltage level being higher than a ground level of voltage.

19. The method of claim 18, wherein the bitcell further comprises a third transistor, the method further comprising:
supplying a fourth signal of a fourth voltage level to a gate of the third transistor, the fourth voltage level to switch on the third transistor.

20. The method of claim 18, wherein the bitcell further comprises a capacitor, the method further comprising:

supplying a fourth signal of a fourth voltage level to a terminal of the capacitor, wherein:
a voltage difference equals the fourth voltage level minus the third voltage level; and
the voltage difference is not greater than a breakdown voltage of the capacitor.

* * * * *